United States Patent
Brooks

(10) Patent No.: US 11,144,391 B2
(45) Date of Patent: Oct. 12, 2021

(54) TECHNIQUES FOR GENERATING SYMBOL-PRESERVING ERROR CORRECTION CODES

(71) Applicant: NVIDIA CORPORATION, Santa Clara, CA (US)

(72) Inventor: John Brooks, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 8 days.

(21) Appl. No.: 16/900,754

(22) Filed: Jun. 12, 2020

(65) Prior Publication Data
US 2020/0394104 A1      Dec. 17, 2020

Related U.S. Application Data

(60) Provisional application No. 62/861,244, filed on Jun. 13, 2019.

(51) Int. Cl.
G06F 11/10     (2006.01)
G11C 29/52     (2006.01)
G11C 11/16     (2006.01)

(52) U.S. Cl.
CPC ........ G06F 11/1068 (2013.01); G06F 11/102 (2013.01); G06F 11/1044 (2013.01); G06F 11/1096 (2013.01)

(58) Field of Classification Search
CPC . H03M 13/3723; H03M 13/19; G06F 11/102; G06F 11/1044; G06F 11/1068; G06F 11/1096; G06F 11/1012
See application file for complete search history.

(56) References Cited

U.S. PATENT DOCUMENTS

| | | | |
|---|---|---|---|
| 6,751,769 B2 * | 6/2004 | Chen ................... | G06F 11/1016 714/767 |
| 7,836,116 B1 * | 11/2010 | Goodnight ............ | G06F 17/142 708/404 |
| 2006/0265636 A1 * | 11/2006 | Hummler ............ | G06F 11/1008 714/800 |
| 2015/0106668 A1 * | 4/2015 | Ran ........................ | H04L 1/203 714/704 |
| 2018/0302106 A1 * | 10/2018 | Shokrollahi ...... | H03M 13/6561 |
| 2020/0174883 A1 * | 6/2020 | Chih ................. | H03M 13/2906 |
| 2020/0321983 A1 * | 10/2020 | Qin ........................ | H03M 13/19 |

* cited by examiner

*Primary Examiner* — Guy J Lamarre
(74) *Attorney, Agent, or Firm* — Artegis Law Group, LLP

(57) ABSTRACT

Various embodiments include an on-die error correction code (ECC) system that preserves rectangular symbols of arbitrary size and shape, where the dimensions of the symbol are powers of two. Further, the on-die ECC system preserves symbols that include multiple rectangles of arbitrary size and shape, where the dimensions of each rectangle are powers of two, and where the vertical and horizontal offset between consecutive rectangles are also powers of two. If the on-die ECC system miscorrects a memory bit, then the miscorrection is constrained or restricted to the same symbol that includes the other error bits. Therefore, all error bits, including the miscorrected bit, are in the same symbol. As a result, a user ECC system, such as a symbol-based ECC system, can correct and detect any number of errors within a single symbol, even when the on-die ECC system miscorrects a memory bit.

20 Claims, 21 Drawing Sheets

|  | 1 | 2 | 3 | 4 | 5 | 6 | 7 | 8 | 9 | 10 | 11 |
|---|---|---|---|---|---|---|---|---|---|---|---|
| ODP0 | 1 | 1 | 1 | 1 | 1 | 1 | 1 | 1 | 1 |  |  |
| ODP1 |  |  |  |  |  |  |  |  |  | 1 |  |
| ODP2 |  |  |  |  |  |  |  |  |  | 1 |  |
| ODP3 |  |  |  |  |  |  |  |  |  | 1 |  |
| ODP4 |  |  |  |  |  |  |  |  |  | 1 |  |
| ODP5 |  |  |  |  |  |  |  |  |  | 1 |  |
| ODP6 |  |  |  |  |  |  |  |  | 1 |  |  |
| ODP7 |  |  |  |  |  |  |  |  | 1 |  |  |
| ODP8 |  |  |  |  |  |  |  | 1 |  |  |  |
| ODP9 |  |  |  |  |  |  | 1 |  |  |  |  |
| ODP10 |  |  |  |  |  | 1 |  |  |  |  |  |
| ODP11 |  |  |  |  | 1 |  |  |  |  |  |  |
| ODP12 |  |  |  | 1 |  |  |  |  |  |  |  |
| ODP13 |  |  | 1 |  |  |  |  |  |  |  |  |
| ODP14 |  | 1 |  |  |  |  |  |  |  |  |  |
| ODP15 | 1 |  |  |  |  |  |  |  |  |  |  |

TECHNIQUES FOR GENERATING SYMBOL-PRESERVING ERROR CORRECTION CODES

CROSS-REFERENCE TO RELATED APPLICATIONS

This application claims benefit of United States provisional patent application titled, "Symbol-Preserving Error Correction Codes," filed Jun. 13, 2019 and having Ser. No. 62/861,244. This application is hereby incorporated herein by reference.

BACKGROUND

Field of the Various Embodiments

Various embodiments relate generally to computer memory systems and, more specifically, to techniques for generating symbol-preserving error correction codes.

Description of the Related Art

Computer systems generally include, among other things, one or more processors, such as central processing units (CPUs) and/or graphics processing units (GPUs), and one or more memory subsystems. The memory subsystems store instructions that the processors execute in order to perform various tasks. During execution of these instructions, the processors store data in and retrieve data from the memory subsystems. This data includes values that the processors access to perform the tasks, as specified by the instructions.

Memory devices included in memory subsystems are composed of memory cells, where each cell stores one binary digit (referred to herein as a "bit"), where the value of the bit can be 0 or 1. Multiple bits are concatenated to form the instructions and data. These memory cells are prone to various types of defects that can corrupt one or more bits stored in the memory device. One type of error, referred to herein as a "hard error," is a permanent error that is repaired before the memory device is shipped, or alternatively, the memory device is discarded as defective. Another type of error, referred to herein as a "soft error," is a temporary error that intermittently corrupts one or more bits stored in the memory cells. One such type of soft error occurs when an alpha particle strikes a memory cell or a portion of the logic circuits that store data in and retrieve data from the memory cells. If an alpha particle strikes a memory cell, then the value of the memory cell may incorrectly change from 0 to 1 or from 1 to 0. This type of soft error persists until a different value is stored in the memory cell. If an alpha particle strikes a logic circuit during retrieval of data from a group of memory cells, then the memory device may transmit incorrect instructions and/or data to the processor at the time of the alpha particle strike. However, if the same group of memory cells is accessed subsequent to the alpha particle strike, then the memory device may transmit either the correct or incorrect instructions and/or data to the processor.

In order to alleviate such soft errors, memory devices typically include an error correction code (ECC) system on the die of the memory device. This type of ECC system is referred to herein as an "on-die" ECC system or an "inner" ECC system. This type of ECC system detects and corrects certain types of soft errors that occur within a particular group of memory cells referred to herein as a "codeword." A codeword includes a set of user data bits and one or more sets of ECC bits. Certain on-die ECC systems can detect and correct a single error bit, also referred to herein as a "corrupt bit," in a codeword. However, if more than one error bit exists in a codeword, then such an on-die ECC system cannot reliably correct or detect such an error. This type of ECC system is referred to as a single error correction (SEC) system. Certain other on-die ECC systems can detect and correct a single error bit in a codeword and can detect, but not correct, two error bits in a codeword. However, if more than two bits in a codeword is in error, then such an on-die ECC system cannot reliably correct or detect such an error. This type of ECC system is referred to as a single error correction double error detection (SEC-DED) system.

Although memory devices can include on-die ECC systems that can correct and/or detect more than two error bits in a codeword, such ECC systems consume a greater number of the memory cells to perform the ECC function and, therefore, are not cost effective to include in an on-die ECC system. Therefore, other devices in the computer system, such as a memory management unit (MMU), may include a more sophisticated ECC system for detecting and correcting multiple error bits in a codeword. This type of ECC system is referred to herein as a "user" ECC system or an "outer" ECC system. Certain types of user ECC systems, known as "symbol-based" ECC systems, can detect and correct any number of error bits within a group of bits that have a defined shape and size. This group of bits is referred to herein as a "symbol." The size and shape of this symbol may be, and often has been, arbitrarily chosen by the system designer. Even so, the symbol size and shape are advantageously chosen based on the specific characteristics of the DRAM device. For a given system and memory device combination, each symbol has the same shape and size and may include any number of bits, such as 4 bits, 8 bits, 16 bits, 32 bits, and/or the like. In general, the shape, size, and number of bits of the symbol should be selected based on the typical forms of multibit soft errors that a particular type of memory device is prone to exhibit, such that this ECC system is able to correct such multibit errors. In combination, an on-die ECC system corrects and/or detects certain types of soft errors, while the user ECC system corrects and/or detects certain additional types of soft errors.

One drawback with this approach for correcting and/or detecting soft errors in memory devices is that, under certain conditions, an on-die ECC system can incorrectly change a memory cell that cannot be corrected by the user ECC system. Such a condition may occur when a codeword includes more error bits than the on-die ECC is designed to detect. In such situations, the on-die ECC system may incorrectly determine that the codeword includes, for example, a single error bit and attempt to correct the bit that is incorrectly identified as an error bit. As a result, the on-die ECC system changes the contents of a memory cell that contains the correct bit value, thereby corrupting the bit value in the memory cell. This type of bit value corruption is referred to herein as a "miscorrection." In general, the memory cell that is miscorrected by the on-die ECC system can be located anywhere in the codeword. If, however, the miscorrected memory cell is not located within the symbol that includes the other error bits, the miscorrection cannot be corrected by a symbol-based user ECC system. On the other hand, if there was no on-die ECC system at all, then the miscorrection would not occur and the user ECC system could have corrected the actual error bits.

As the foregoing illustrates, what is needed in the art are more effective techniques for detecting and correcting errors in memory systems.

SUMMARY

Various embodiments of the present disclosure set forth a computer-implemented method for generating error correction codes within an error correction code system. The method includes generating values for a set of on-die ECC bits based on a set of user data bits and a parity-check matrix. The method further includes determining, based on the parity-check matrix, that a value stored in a first bit included in at least one of the set of on-die ECC bits or the set of user data bits is incorrect. When the first bit is not, in fact, incorrect, i.e. when the code is miscorrecting, the parity-check matrix restricts the first bit to a location within a symbol that includes a second bit or bits, where a value stored in the second bit or bits is incorrect. The method further includes modifying the value stored in the first bit.

More generally, when multiple bits in a codeword are incorrect the on-die ECC system has a possibility of performing a miscorrection. When these multiple incorrect bits all lie within a single symbol (which is a relatively common error pattern), the parity check matrix restricts the miscorrected bit to one of the bits of the symbol which already contains incorrect bits. The number of incorrect symbols therefore remains at one symbol, and a symbol-oriented outer ECC system can properly handle such an error.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, miscorrections generated by an on-die ECC system are constrained or restricted to be within the smallest reasonable symbol that includes all of the other error bits. Therefore, the error bits included in the codeword transmitted by the memory device are all within the same symbol. As a result, a user ECC system, such as a symbol-based user ECC system, is able to correct all of the actual error bits as well as the miscorrected bit. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

Figures 6A, 6B:
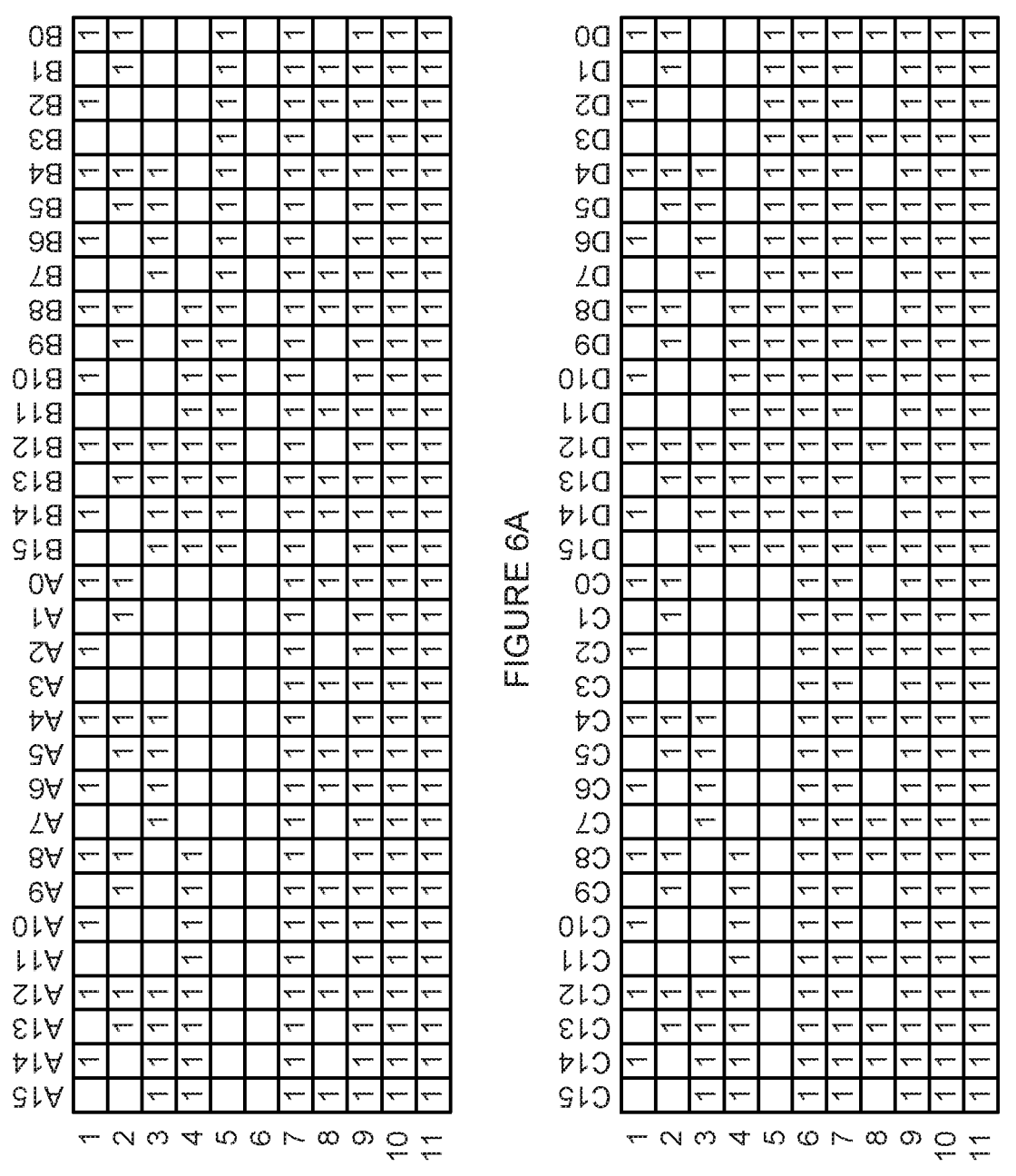
Figures 6C, 6D:
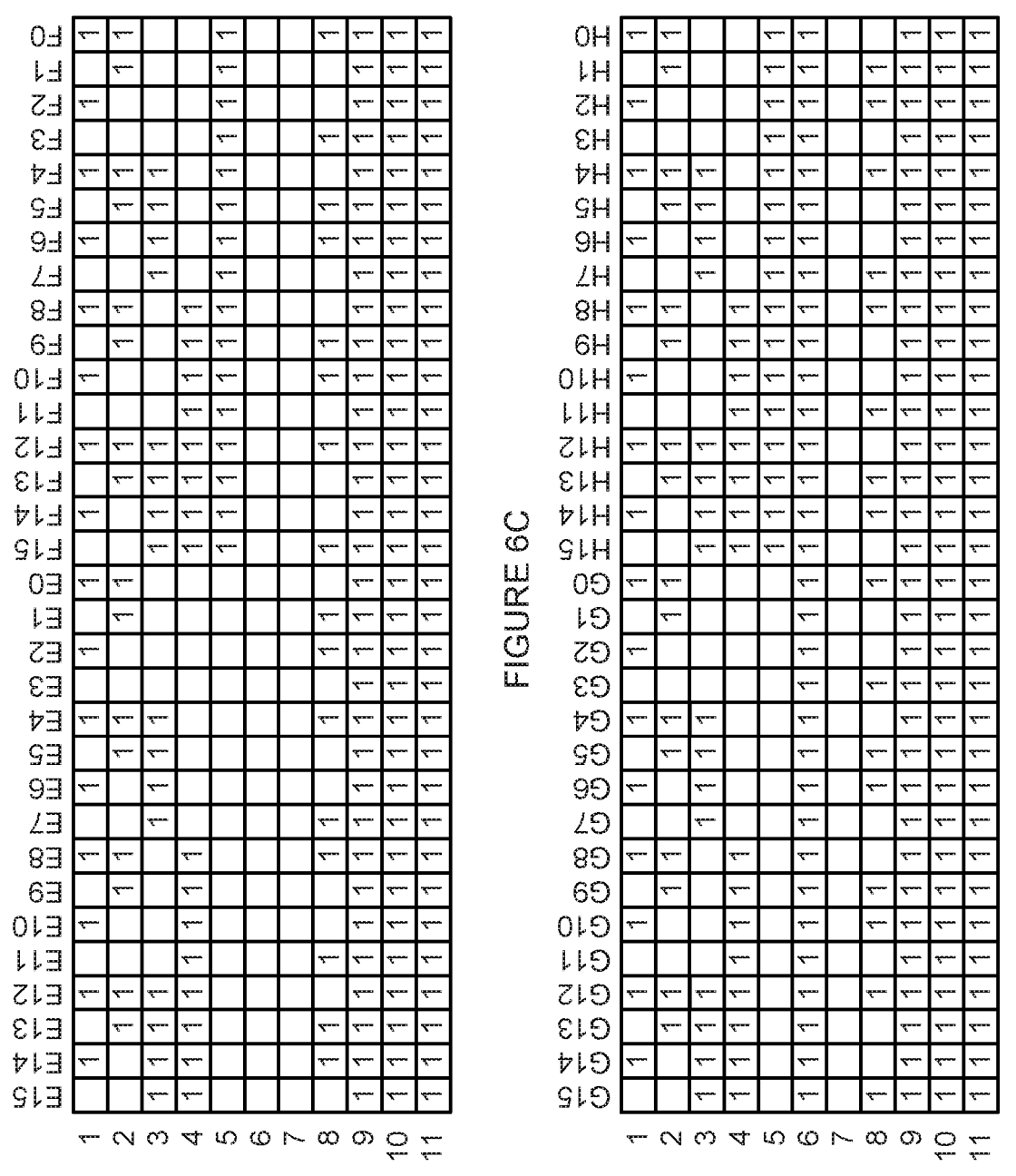
Figures 6E, 6F:
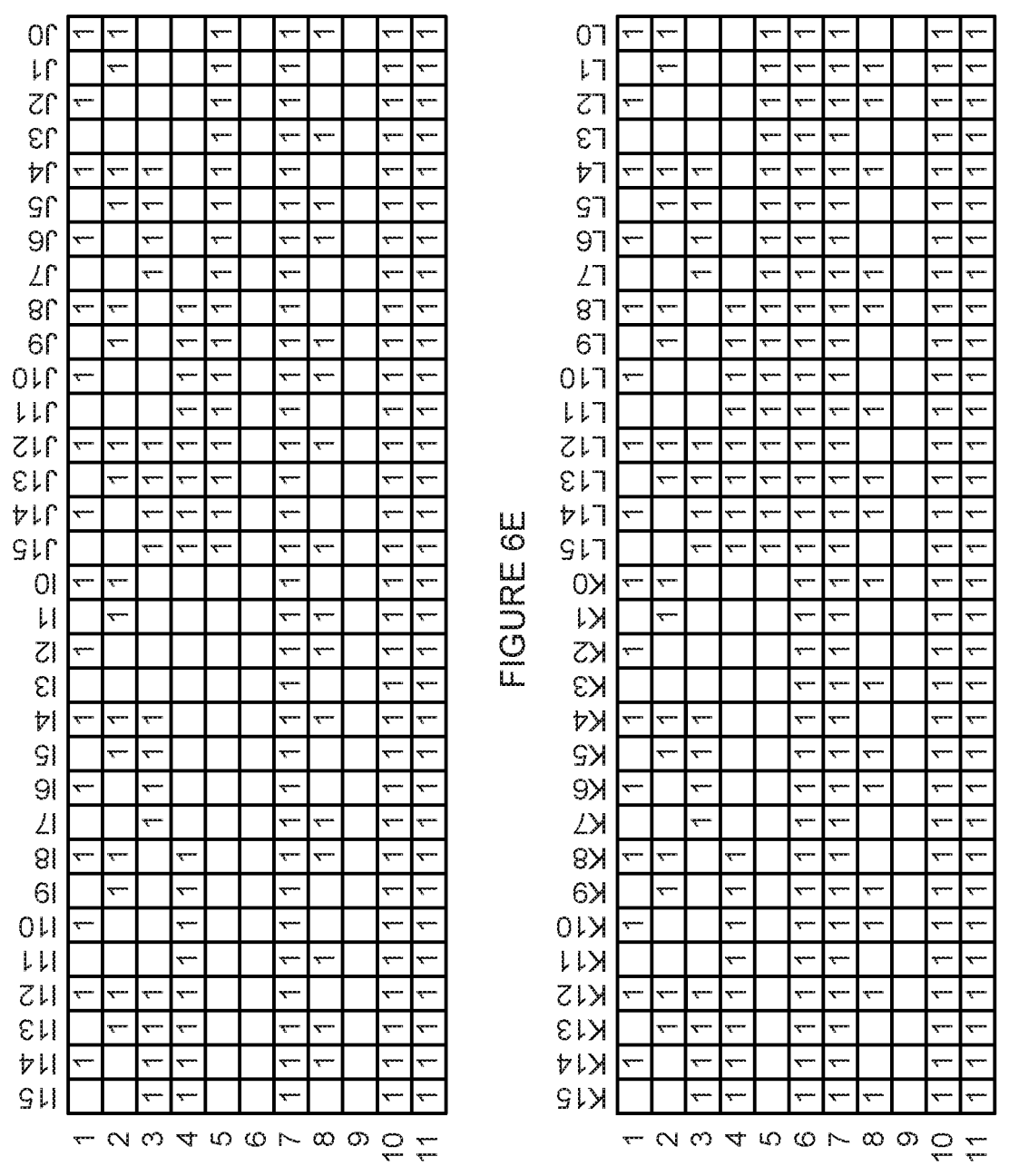
Figures 6G, 6H:
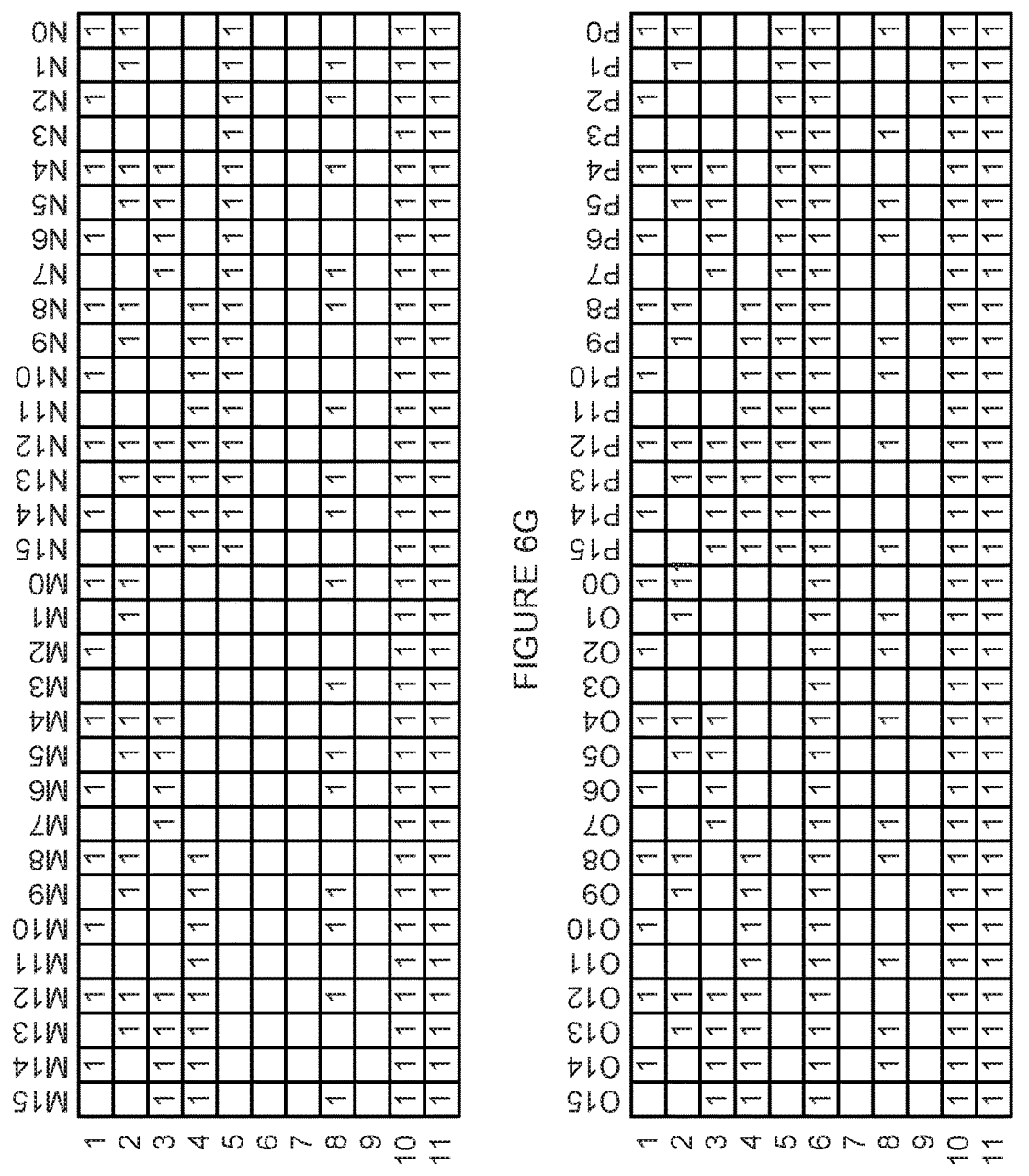

FIGS. 6A-6I illustrate an example H-matrix for an LPDDR memory device, according to various embodiments;

FIGS. 10A-10J illustrate an example H-matrix for an HBM memory device, according to various embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
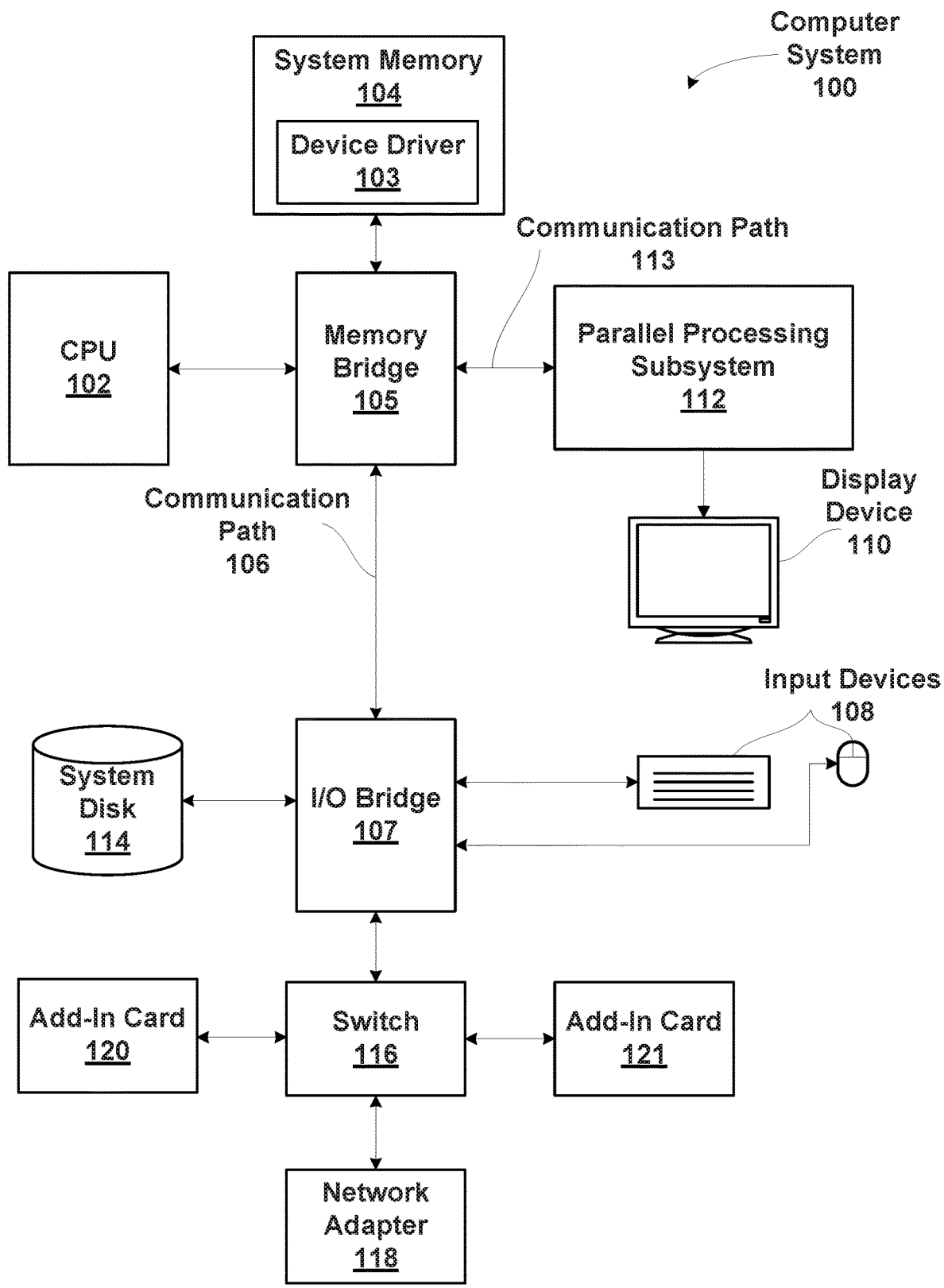
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
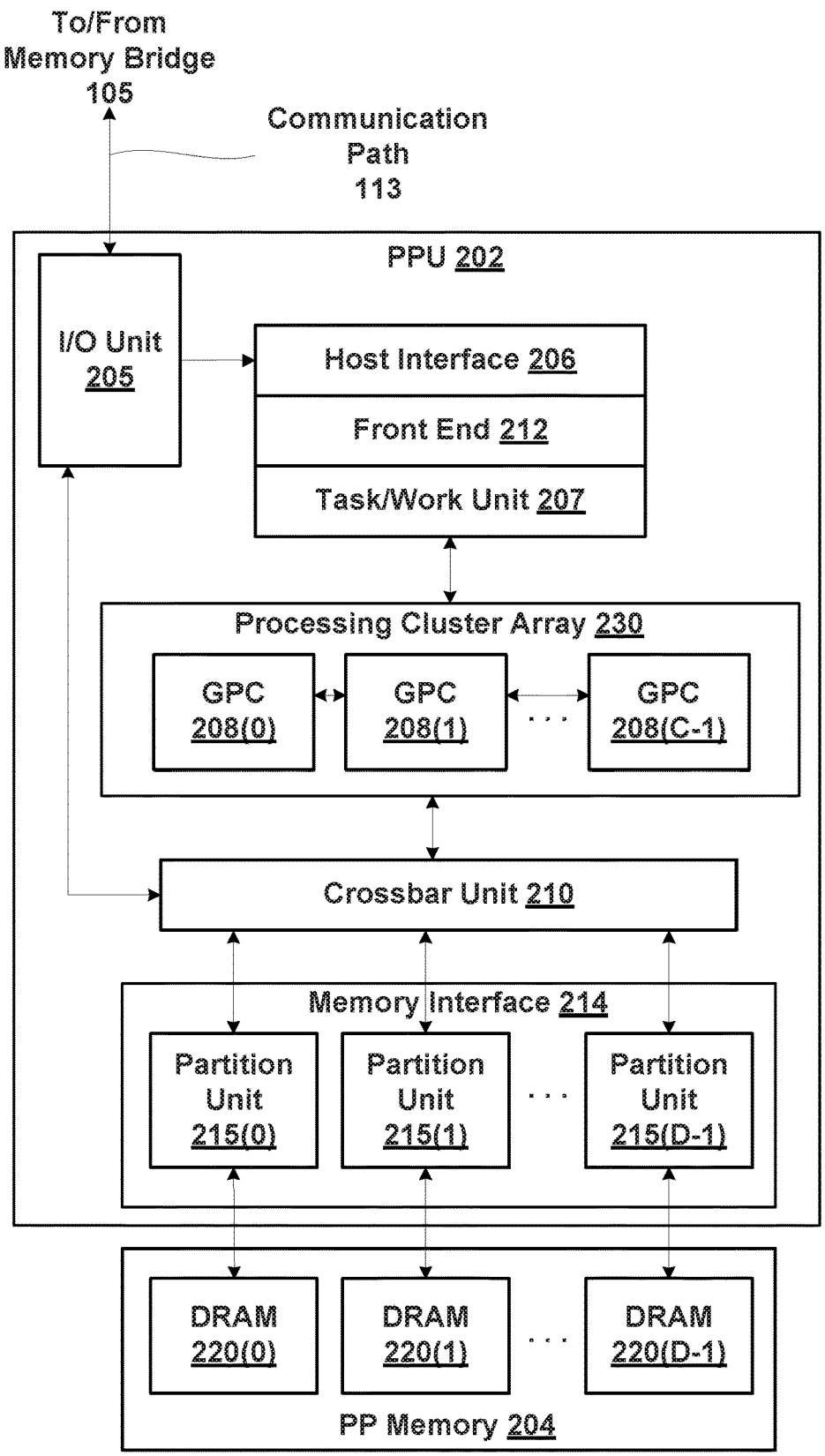
FIG. 2 is a block diagram of a parallel processing unit (PPU) included in the parallel processing subsystem of FIG. 1, according to various embodiments.

FIG. 2 is a block diagram of a parallel processing unit (PPU) 202 included in the parallel processing subsystem 112 of FIG. 1, according to various embodiments. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C 1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D 1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
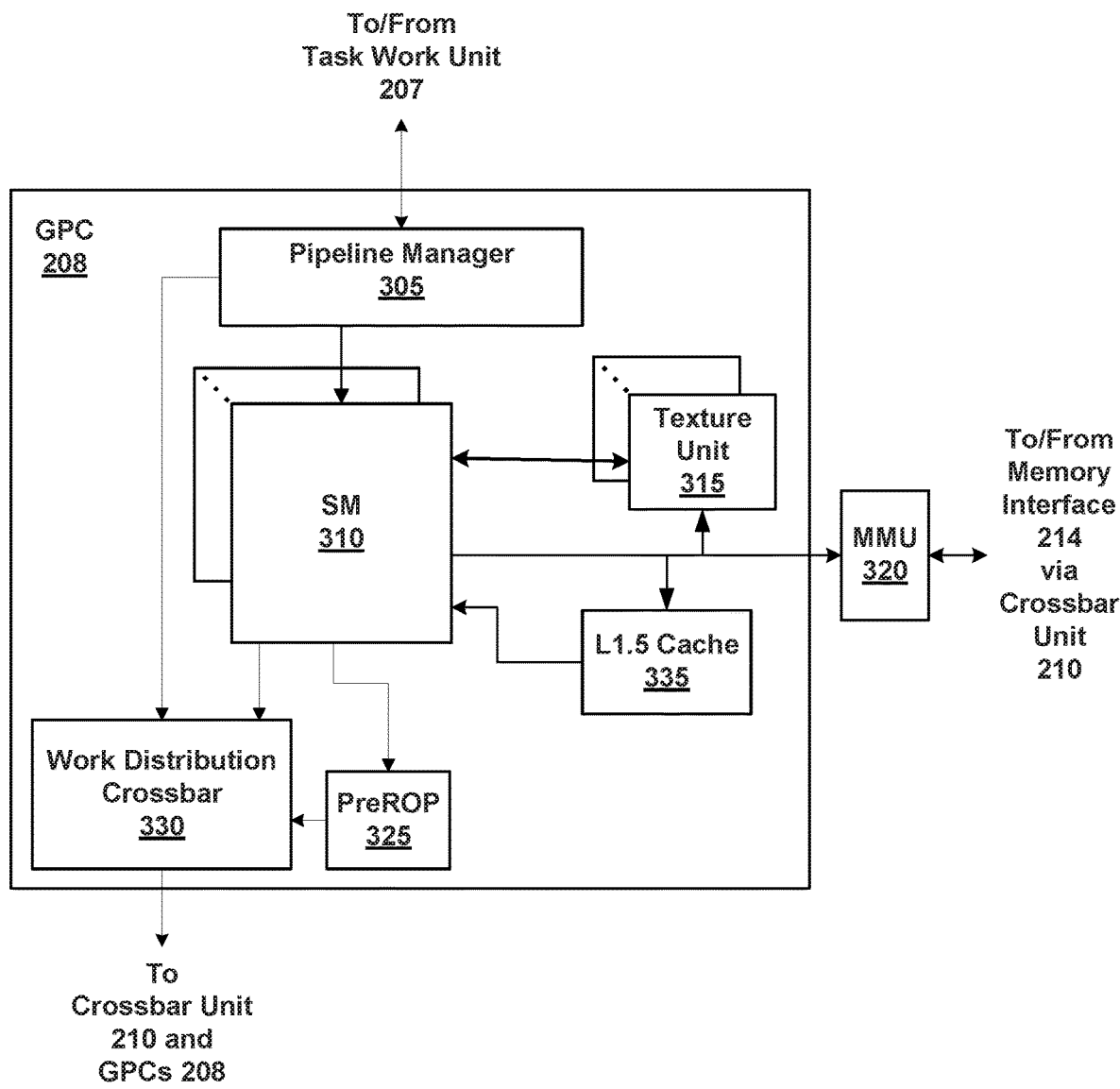
FIG. 3 is a block diagram of a general processing cluster (GPC) included in the parallel processing unit (PPU) of FIG. 2, according to various embodiments.

FIG. 3 is a block diagram of a general processing cluster (GPC) 208 included in the parallel processing unit (PPU) 202 of FIG. 2, according to various embodiments. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the various embodiments of the present disclosure.

Please note, as used herein, references to shared memory may include any one or more technically feasible memories, including, without limitation, a local memory shared by one or more SMs 310, or a memory accessible via the memory interface 214, such as a cache memory, parallel processing memory 204, or system memory 104. Please also note, as used herein, references to cache memory may include any one or more technically feasible memories, including, without limitation, an L1 cache, an L1.5 cache, and the L2 caches.

Generating Symbol-Preserving Error Correction Codes

Figure 4:
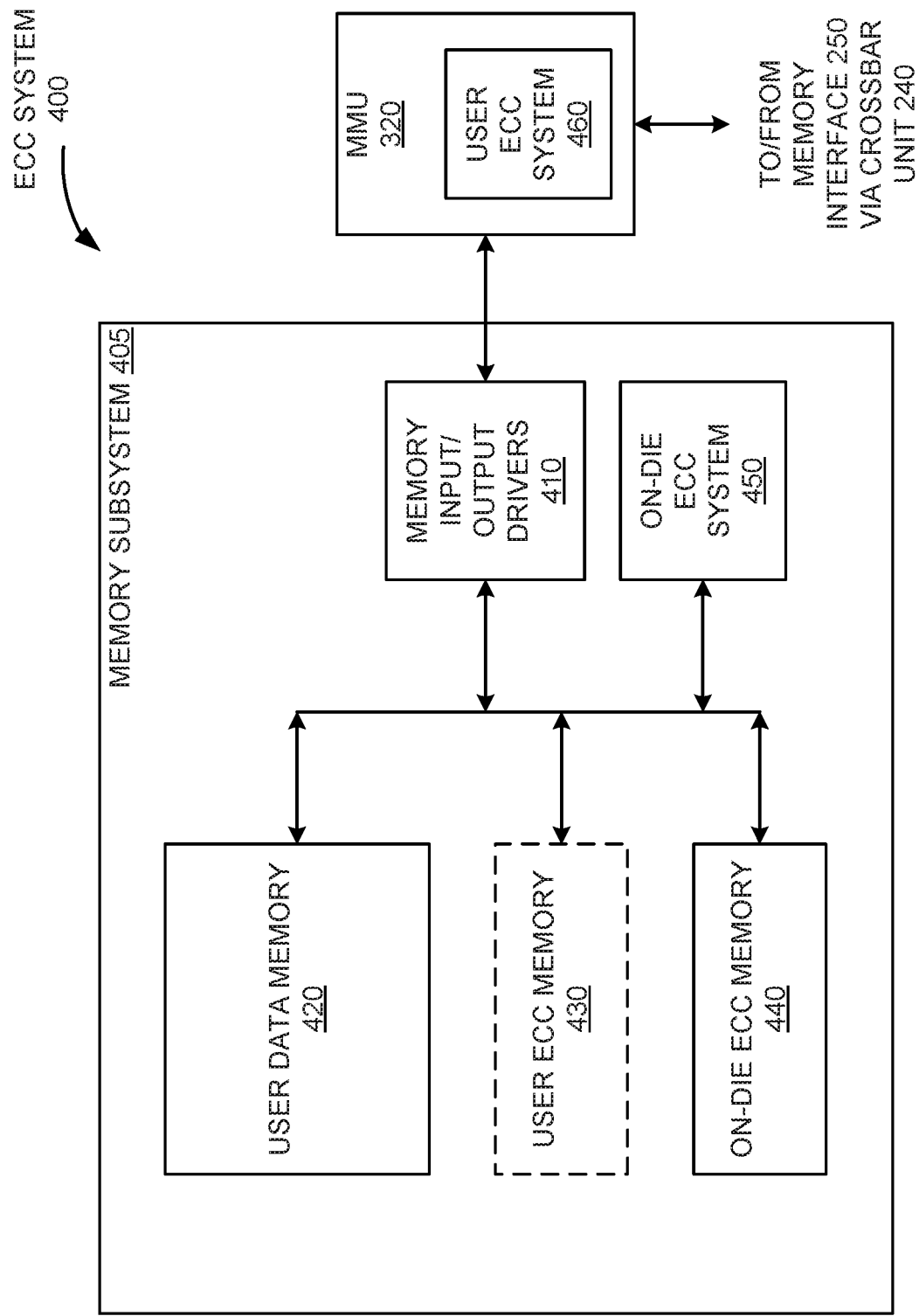
FIG. 4 is a block diagram of an error correction code (ECC) system that the system of FIGS. 1-3 can be configured to implement, according to various embodiments.

FIG. 4 is a block diagram of an error correction code (ECC) system 400 that the system of FIGS. 1-3 can be configured to implement, according to various embodiments. As shown, the ECC system 400 includes a memory subsystem 405 and the MMU 320 of FIG. 3. The memory subsystem 405 may include any shared memory, including, without limitation, a local memory shared by one or more SMs 310, or a memory accessible via the memory interface 214, such as a cache memory, parallel processing memory 204, or system memory 104. The memory subsystem 405 further includes memory input/output drivers 410, user data memory 420, optional user ECC memory 430, on-die ECC memory 440, and an on-die ECC system 450. The MMU 320 further includes a user ECC system 460.

The memory input/output drivers 410 include logic circuits for storing data in and retrieving data from one or more of user data memory 420, user ECC memory 430, and on-die ECC memory 440. The memory input/output drivers 410 is susceptible to soft errors that may cause one or more error bits when storing data in and retrieving data from user data memory 420, user ECC memory 430, and on-die ECC memory 440.

User data memory 420 stores instructions that processors, such as CPU 102 and SMs 310, execute in order to perform various tasks. User data memory 420 further stores data that the processors access to perform tasks, as specified by the instructions. User ECC memory 430 stores ECC bits that are written and read by the user ECC system 460 in the MMU 320. Similarly, on-die ECC memory 440 stores ECC bits that are written and read by the on-die ECC system 450 in the memory subsystem 405.

The arrangement of user data memory 420, user ECC memory 430, and on-die ECC memory 440 varies depending on the type of memory devices included in the memory subsystem 405. One type of memory device is low-power double data rate (LPDDR) devices. LPDDR devices are generally designed for high-density and feature narrower data paths and lower cost. In a typical LPDDR device, data is stored and retrieved in a data "burst" that includes 16 consecutive clock cycles. Each clock cycle transfers 16-bits of user data memory 420. LPDDR memory devices do not typically include dedicated user ECC memory 430. Therefore, a data burst includes 16×16=256 bits of user data memory 420. In addition, 1×16=16 bits of on-die ECC memory 440 are not transferred with the burst, but are nonetheless associated with reading or writing the data memory 420. Taken together, the user data memory 420 and on-die ECC memory 440 data bits associated with a single data burst form a codeword that is processed by the on-die ECC system 450.

Another type of memory device is high-bandwidth memory (HBM) devices. HBM devices are generally designed for high-performance and feature wide data paths and fast read/write times. In a typical HBM device, data is stored and retrieved in a data "burst" that includes 8 consecutive clock cycles. Each clock cycle transfers 32-bits of user data memory 420 and 4 bits of user ECC memory 430. Therefore, a data burst includes 8×32=256 bits of user data memory 420 and 8×4=32 bits of user ECC memory 430. In addition, 8×2=16 bits of on-die ECC memory 440 are not transferred in the burst, but are nonetheless associated with this burst. Taken together, the user data memory 420, user ECC memory 430, and on-die ECC memory 440 data bits associated with a single data burst form a codeword that is processed by the on-die ECC system 450.

As further described herein, the on-die ECC system 450, also referred to herein as an on-die ECC subsystem, generates error correction codes with the characteristic that, if the on-die ECC system 450 miscorrects a bit, then the miscorrected bit is constrained or restricted to be within the same symbol as the other error bits—as long as such other data bits are already located within a single symbol. The miscorrection is thus prevented from disturbing any of the remaining, correct symbols. This characteristic is referred to herein as "preserving" the symbols. Note that if multiple symbols are already in error, then the on-die ECC system 450 may not be symbol-preserving. The on-die ECC system 450 preserves rectangular symbols of arbitrary size and shape, where the dimensions of the symbol are powers of two. Further, the on-die ECC system 450 preserves symbols that include multiple rectangles of arbitrary size and shape, where the dimensions of each rectangle are powers of two, and where the vertical and horizontal offset between consecutive rectangles are also powers of two. Symbols defined as thus described are referred to herein as "reasonable symbols." If the on-die ECC system 450 miscorrects a memory bit, then the miscorrection is in the same symbol that includes the other error bits. Therefore, all error bits, including the miscorrected bit, are in the same symbol. As a result, the user ECC system 460 is able to correct and detect any number of errors within a single symbol, even when the on-die ECC system 450 miscorrects a memory bit.

The user ECC system 460 in the MMU 320 performs ECC correction and detection in addition to the ECC correction and detection performed by the on-die ECC system 450. The user ECC system 460 stores data in and retrieves data from user data memory 420 and user ECC memory 430 but does not access on-die ECC memory 440. The user ECC system 460 performs any of one or more technically feasible types of ECC correction and detection, including, without limitation, symbol-based ECC, vertically striped ECC, horizontally striped ECC, diagonally striped ECC, and SEC-DED ECC.

During write operations, the MMU 320 stores data to user data memory 420. In parallel, the user ECC system 460 generates user ECC bits that the MMU 320 stores in user ECC memory 430. In case of a memory subsystem 405 that does not include user ECC memory 430, the user ECC system 460 generates user ECC bits that the MMU 320 stores in a portion of user data memory 420 that is designated for user ECC bits. The MMU 320 stores data to user data memory 420 and user ECC memory 430 via the memory input/output drivers 410. In parallel, the on-die ECC system 450 generates on-die ECC bits and stores the on-die ECC bits in on-die ECC memory 440.

During read operations, the on-die ECC system 450 receives data from user data memory 420, user ECC memory 430, and on-die ECC memory 440. The on-die ECC system 450 checks error correction codes and determines whether the data is indicative of one or more soft errors. If the on-die ECC system 450 determines that the data is indicative of one or more soft errors, then the on-die ECC system 450 corrects and/or detects error bits according to the capabilities of the on-die ECC system 450. After correction and/or detection, the memory subsystem 405 transmits the data bits from user data memory 420 and user ECC memory 430 to the MMU 320. The user ECC system 460 checks additional error correction codes and determines whether the data is indicative of one or more soft errors. If the user ECC system 460 determines that the data is indicative of one or more soft errors, then the user ECC system 460 corrects and/or detects error bits according to the capabilities of the user ECC system 460.

In operation, the on-die ECC system 450 generates ECC bits according to a parity-check matrix, referred to herein as an "H-matrix." The on-die ECC system 450 corrects a single error bit in a codeword and detects two error bits in a codeword (SEC-DED). In some embodiments, the on-die ECC system for certain DRAM memories may be a single error correction (SEC) system. In a SEC-DED system, if a codeword includes a single error bit, then the on-die ECC system 450 corrects the error bit. If the codeword includes two error bits, then the on-die ECC system 450 detects, but does not correct, the error bits. Similarly, if the codeword includes an even number of error bits greater than two, then the on-die ECC system 450 detects, but does not correct, the error bits. However, if the codeword includes an odd number of error bits greater than or equal to three, then the on-die ECC system 450 detects and attempts to correct one of the error bits, potentially resulting in a miscorrection. Because of the construction of the H-matrix, the on-die ECC system 450 miscorrects within the same symbol that includes the other error bits. More specifically, the on-die ECC system 450 miscorrects within the smallest reasonable symbol that includes the other error bits. As a result, if only one symbol in the codeword includes error bits originally, then only that same symbol contains error bits after this miscorrection occurs.

In general, the existence of two or more error bits at random locations in a codeword is rare. Instead, when a codeword includes two or more errors, such an error condition is generally caused by a single logic error within the memory device. In such cases, the error bits are typically collocated in some geometric relationship within a group of bits, or symbol, that has a defined shape and size. The size and shape of the symbol generally depends on the internal architecture of the memory device and varies depending on the type of memory device. The symbol size and shape are expressed by the number of rows times the number of columns, where each of the number of rows and the number of columns is a power of two. Example symbols include, without limitation, 1×4, 1×8, 1×16, 1×32, 1×64, 1×128, 2×2, 2×4, 2×8, 2×16, 2×32, 2×64, 4×1, 4×2, 4×4, 4×8, 4×16, 4×32, 8×1, 8×2, 8×4, 8×8, 8×16, 16×1, 16×2, 16×4, 16×8, 16×16, 32×1, 32×2, 32×4, 64×1, 64×2, and 128×1. A symbol may include multiple disjoint groups of bits, where the number of rows and the number of columns for each group of bits are powers of two, and the vertical and/or horizontal offsets between consecutive groups of bits are also powers of two. The symbol size and shape are expressed by (the number of rows times the number of columns) times the number of groups. Example symbols of this type include, without limitation, (1×4)×2, (1×2)×4, (4×1)×2, and (2×1)×4.

The on-die ECC system 450 does not select or have knowledge of the appropriate symbol a priori. Instead, the H-matrix constrains or restricts the on-die ECC system 450 to correct, and miscorrect, bits that are within the same symbol as the other error bits, so long as the symbol conforms to the dimensions and offsets described herein, and all error bits lie within a single symbol. In various embodiments, for a given set of error bits, the on-die ECC system 450 preserves the smallest symbol that includes all of the original error bits, by forcing any possible miscorrection to occur within that same smallest symbol. Although only a particular symbol is generally relevant for a particular type of memory device, the on-die ECC system 450 preserves all reasonable symbol shapes, sizes, and offsets. As a result, the on-die ECC system 450 constrains or restricts miscorrections to a single symbol, regardless of the dimensions and offsets of the relevant symbol for the type of memory device and for the user ECC system 460.

Although the symbol may be of any size, shape, and offset, very large and very small symbols are generally impractical. Although a 32-bit symbol is possible, a symbol-based error-correction code to correct a single 32-bit symbol requires 64 ECC bits. Therefore, in order to protect 256 bits of user data, 64 bits of ECC represents a 64/256=25% overhead, which is generally too much memory overhead for practical applications. A symbol-based error correction code to correct a single 4-bit symbol only requires 8 bits. However, a 4-bit symbol is too small to protect 256 bits of user data. Therefore, using a 4-bit symbol involves dividing 256 bits of user data in a data burst into multiple codewords (as many as 8 codewords), thereby adding complexity and, once again, too much overhead. As a result, 8-bit symbols and 16-bit symbols are typically considered the most practical symbol sizes for such symbol-based codes.

Various techniques employed by the user ECC system 460 may benefit from the symbol-preserving ECC performed by the on-die ECC system 450. In some embodiments, the user ECC system 460 may employ a symbol-based ECC approach. With single-symbol correction ECC (referred to herein as "SSC"), the user ECC system 460 is able to correct all error bits in one symbol included in the codeword. Similarly, with double-symbol correction ECC (referred to herein as "DSC"), the user ECC system 460 is able to correct all error bits in up to two symbols included in the codeword, and so on. The on-die ECC system 450 constrains or restricts miscorrections to occur within the smallest symbol that includes all of the original error bits. As a result, symbol-based ECC employed by the user ECC system 460 is not negatively impacted by such miscorrections performed by the on-die ECC system 450.

In some embodiments, the user ECC system 460 may employ a striping-based ECC approach, where the user ECC system 460 utilizes multiple codewords "striped" in either a horizontal or a vertical fashion. When the multiple codewords are horizontally striped, then the bits within a vertical symbol are uniformly distributed across all codewords. Thus, a single corrupted 8-bit symbol, for example, could be spread across 4 codewords, limiting the errors in a single codeword to no more than 2 bits. If each codeword employs a SEC-DED ECC, then this multi-bit error can be safely detected by the SEC-DED codes. Similarly, when the multiple codewords are vertically striped, then the bits within a horizontal symbol are uniformly distributed across all codewords. This technique similarly limits the error bits per codeword, allowing simple SEC-DED codes to handle up to all bits of the symbol being corrupted. Utilizing a symbol-preserving code, the ECC system 450 would preserve these characteristics even after a miscorrection. When the multiple codewords are diagonally striped, then the bits within either a horizontal symbol or a vertical symbol are uniformly distributed across all codewords. This technique limits the error bits per codeword in either case, allowing simple SEC-DED codes to handle up to all bits of the symbol being corrupted. The symbol-preserving nature of the ECC system 450 preserves this situation by forcing miscorrection to occur within the same symbol. As a result, striping-based ECC employed by the user ECC system 460 is not negatively impacted by the on-die ECC system 450.

In some embodiments, the user ECC system 460 may employ a SEC-DED ECC approach, where the user ECC system 460 corrects one error bit in a codeword and detects two error bits in a codeword. If the original codeword has a single error bit, then the on-die ECC system 450 properly corrects the error, and the user ECC system 460 does nothing. If the original codeword has two error bits, then each of the on-die ECC system 450 and the user ECC system 460 detects, but does not correct, the error bits. Similarly, if the original codeword has an even number of error bits greater than two, then each of the on-die ECC system 450 and the user ECC system 460 detects, but does not correct, the error bits. If the original codeword has an odd number of error bits greater than or equal to three, then the on-die ECC system 450 miscorrects a bit within the same symbol as the other error bits, resulting in a codeword with an even number of errors. Therefore, the user ECC system 460 detects, but does not correct, the error bits, resulting in a single miscorrection. As a result, SEC-DED ECC employed by the user ECC system 460 is not negatively impacted by the on-die ECC system 450.

It will be appreciated that the on-die ECC system 450 described herein is illustrative and that variations and modifications are possible. Among other things, although the disclosed techniques are described in the context of memory subsystems, any system that employs hierarchical error correction codes is within the scope of the present disclosure, including, without limitation, transmitting data via electrical interfaces and communications systems. Further, the disclosed techniques are described in the context of LPDDR and HBM memory devices. However, the disclosed techniques may be applied to any technically feasible type of memory device, within the scope of the present disclosure.

Figure 5:
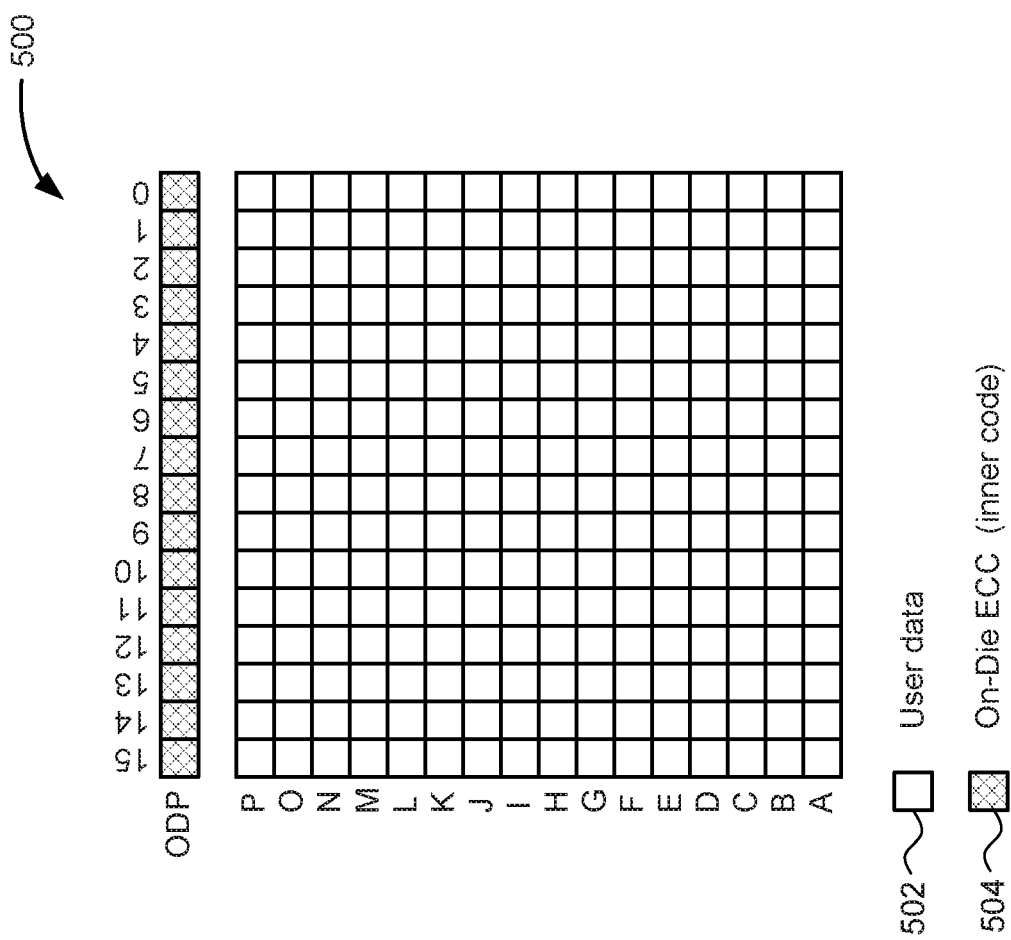
FIG. 5 illustrates a codeword associated with an LPDDR memory device, according to various embodiments.

FIG. 5 illustrates a codeword 500 associated with an LPDDR memory device, according to various embodiments. The codeword 500 includes user data bits 502 and on-die ECC bits 504. The codeword 500 is organized into 16 rows, labeled A-P. The user data bits 502 are organized into 16 columns, labeled 15-0. The total number of user data bits 502 is 16×16=256 bits. The on-die data bits 504 are organized into a single row of 16 columns. The total number of on-die data bits 504 is 1×16=16 bits. As further described herein, each of the user data bits 502 and on-die ECC bits 504 corresponds to a different column in the H-matrix for the LPDDR codeword 500.

FIGS. 6A-6I illustrate an example H-matrix for an LPDDR memory device, according to various embodiments. The H-matrix includes a column for each bit in the codeword 500 illustrated in FIG. 5. Each column defines how the on-die ECC system 450 computes the ECC value for the corresponding bit in the codeword 500. Each bit position in the H-matrix represents a value of 1 or a value of 0. For clarity, only the 1 values are shown in FIGS. 6A-6I. A blank bit position indicates a value of 0. As described herein, LPDDR memory devices do not include user ECC memory 430. Therefore, the H-matrix shown in FIGS. 6A-6I does not include columns for user ECC bits. Instead, the H-matrix includes only columns for user data bits, shown in FIGS. 6A-6H, and on-die ECC bits, shown in FIG. 6I. Further, because LPDDR memory is arranged as 16 rows of 16 bits, the column labels reflect the labeling shown in the codeword 500 associated with an LPDDR memory device, shown in FIG. 5. Because the LPDDR memory devices provide no extra bits for user ECC (or outer ECC), implementing the user ECC system 460 in LPDDR memory devices generally requires that the user ECC bits be stored as user data bits at another location in the memory device or in another memory device. The choice of location for such storage of user ECC bits is generally made by the system designer.

The H-matrix defines the ECC bits that on-die ECC system 450 generates and stores for a particular codeword 500. The H-matrix is constructed such that, as long as all errors lie within a single symbol, any correction or miscorrection performed by the on-die ECC system 450 occurs within the same symbol as the symbol that includes the other error bits. This characteristic results from the fact that most of bits in the H-matrix columns for any group of bits that form a symbol are identical, and this group contains every possible combination of the non-identical bits. Recall that even numbers of error bits will be detected, but not corrected. Since miscorrection occurs only with odd numbers of original error bits, such identical bits will exclusive-or (XOR) right back to their original value. As a result, the error pointer used for correction points to one of the columns of the H-matrix corresponding to the symbol containing the original errors. The only bits that vary are those bits that define the location within the symbol. For example, any 8-bit symbol corresponds to 8 columns in the H-matrix, where those 8 columns have identical bits in all but three bits. Those three non-identical bits define 8 unique locations within the 8 bits that form the symbol. And exclusive-or'ing 3, 5, or 7 sets of the identical bits together results in the same identical bit value. Similarly, any 16-bit symbol corresponds to 16 columns in the H-matrix, where those 16 columns have identical bits in all but four bits. Those four non-identical bits define 16 unique positions within the grouping of 16 bits that form the symbol. And the remaining identical bits XOR back to their original value for any odd number of original error bits, thereby causing a correction, or a miscorrection, to a bit within the same symbol. In general, the non-identical bits XOR to SOME value. Since all possible values of these bits exist within the columns comprising the symbol, the error pointer therefore points to one of these columns. This characteristic exists within the H-matrix regardless of the size, shape, or number of bit groups in the symbol. This characteristic exists for any symbol where the number of rows and the number of columns for each group of bits in the symbol are powers of two, and the vertical and/or horizontal offsets between consecutive groups of bits are also powers of two.

The H-matrix shown in FIGS. 6A-6I is one such matrix and is now described. Notably, the column labeling in the H-matrix corresponds with bit positions in the codeword 500. The labeling of the H-matrix columns defines each bit position by concatenating the row label and the column label of such bit location in FIG. 5. For example, the label A15, thus corresponds to row A, column 15, the label P3 corresponds to row P, column 3, and the label ODP0 corresponds to column 0 of the ODP row. For the user data bits, shown in FIGS. 6A-6H, the first two rows of the H-matrix, representing bits 2 and 1, are configured to present a counting sequence of 0, 1, 2, 3 that repeats across all the user data bits. In particular, the A15 column has 0 bits for rows 2 and 1, representing a binary value of 00. The A14 column has a 0 bit for row 2 and a 1 bit for row 1, representing a binary value of 01. The A13 column has a 1 bit for row 2 and a 0 bit for row 1, representing a binary value of 10. The A12 column has 1 bits for rows 2 and 1, representing a binary value of 11, and so on. The next two rows of the H-matrix, representing bits 3 and 4, are configured to present a counting sequence of 3, 2, 1, 0 that repeats across all the user data bits. However, instead of changing the pattern for every consecutive column, the pattern changes every fourth column. The next two rows of the H-matrix, representing bits 5 and 6, are configured to present a counting sequence of 0, 1, 2, 3 that repeats across all the user data bits, where the pattern changes every sixteenth column. Rows 7 and 9 of the H-matrix, representing bits 7 and 9, are configured to present a counting sequence of 3, 2, 1, 0 that repeats across all the user data bits, where the pattern changes every sixty-fourth column.

Row 8 is a parity bit that is populated such that each column in the H-matrix, including the user data bit column and user ECC bit columns, has an odd weight (that is, an odd number of bits set to 1). All columns in the H-matrix have an odd weight in order to distinguish errors on an even number of bits from errors on an odd number of bits, as is common in many SEC-DED codes. An even-weight ECC syndrome indicates that an even number of bits are in error, and the on-die ECC system 450 does not attempt to correct the error. An odd-weight ECC syndrome similarly indicates an odd number of errors, and the on-die ECC system 450 does attempt to correct the error.

Rows 10 and 11 are populated such that each column for a user data bit has a minimum weight of 3 (that is, at least 3 bits are set to 1). As a result, user data bit are distinguishable from the on-die ECC bits, where each column has a weight of 1.

For the on-die ECC bits, shown in FIG. 6I, the first 10 columns, ODP15-ODP6, form a unity matrix for ease in the ECC encoding process, as is common in many H-matrices. ODP5 is a special case which is described below. Ignoring ODP5 for the moment, row 11 is set to 1 for all user data bits and is set to 0 for all on-die ECC bits. Consequently, an error in an odd number of user data bits generates an ECC syndrome with a 1 in this position. In contrast, an error in an odd number of on-die ECC bits generates an ECC syndrome with a 0 in this position. This bit thus distinguishes whether correction takes place in the user data bits or in the on-die ECC bits.

Bit ODP5 is the exception to this rule. An error in an odd number of on-die ECC bits that includes ODP5 generates an ECC syndrome with a 1 in this position, thereby incorrectly appearing to be an error in the user data bits. To prevent this condition, the value of ODP5 is replicated in ODP4-ODP1. All 5 of these bits should be 0 or all 5 of these bits should be 1. If these 5 bits do not all agree, the error is considered uncorrectable. If these 5 bits all agree, the likelihood that the values of these bits are correct is relatively certain. Alternatively, in some embodiments, the correct value for the ODP5 bit may be determined by majority voting logic. Accordingly, the ODP5 bit is replicated in ODP4-ODP1, resulting in an odd number of bits, including ODP5 and the replicas in ODP4-ODP1. Having an odd number of bits prevents a tie in the majority voting logic. The ODP0 bit is not used, and the value of the ODP0 bit is set to a unique encoding which does not appear elsewhere in the H-matrix.

Based on the H-matrix and the layout of the bits transferred in a burst, the sequences which change every column and the sequences which change every fourth column distinguish bits within a horizontal symbol from one another. Higher-order columns, which remain the same, distinguish one horizontal symbol from another horizontal symbol. In a similar fashion, the sequences which change every sixteenth column and the sequences which change every sixty-fourth column distinguish between bits within a vertical symbol, while the lower-order columns distinguish between different vertical symbols.

As described herein, row 8 is populated such that all of the columns have odd parity. Therefore, row 8 has a 1 value for any column that would otherwise have even parity. The value of this approach lies in differentiating even numbers of error bits from odd numbers of error bits. An even number of error bits results in an ECC syndrome with an even parity. Conversely, an odd number of error bits results in an ECC syndrome with an odd parity. The ECC system 450 does not attempt correction if the parity of the ECC syndrome is even, but only when the parity of the ECC syndrome is odd. This result is important in order to maintain the condition described previously herein, where those bits which are identical within a symbol XOR back to the same value, thus pointing somewhere within the same symbol. The resulting H-matrix exhibits characteristic of symbol preservation in the presence of multiple error bits within a single symbol. If multiple error bits exist in a symbol, then the on-die ECC system 450 does not miscorrect a bit into a different symbol.

In the H-matrix of FIGS. 6A-6I, row 1 defines the XOR tree for on-die ECC bit ODP15. Similarly, row 2 defines the XOR tree for bit ODP14, row 3 defines the XOR tree for bit ODP13, row 4 defines ODP012, and so on, for each of rows 1-11 of the H-matrix. The on-die ECC system 450 checks rows 1-11 of the H-matrix to determine whether an error bit exists in a codeword. A zero result for these 11 bits indicates no error. Any non-zero result indicates an error. In the case of an error, the on-die ECC system 450 checks the ECC syndrome for even or odd parity. If the ECC syndrome has even parity, the error is uncorrectable, and the on-die ECC system 450 does not perform any correction. In the case of an error with odd ECC syndrome parity, the on-die ECC system 450 employs all 11 bits of the H-matrix to form a pointer to the error bit for correction.

By differentiating user data bits from on-die ECC bits, row 11 prevents the on-die ECC system 450 from miscorrecting on-die ECC bits based on multiple error bits in the user data. Similarly, row 11 prevents the on-die ECC system 450 from miscorrecting user data bits based on multiple error bits in the on-die ECC error bits.

In some embodiments, if none of the on-die ECC bits are visible to the user ECC system 460, then row 11 of the H-matrix may be eliminated, and the on-die ECC system 450 may employ a 10-row H-matrix. In such embodiments, multiple error bits in in the user data bits may cause miscorrection of a single on-die ECC bit. However, since the on-die ECC bits are not transferred to the MMU 320, the user ECC system 460 does not see this type of error. Therefore, such an error has no negative effect on the user ECC system 460. Further, multiple error bits in the on-die ECC bits may cause miscorrection of a single user data bit or user ECC bit. The user ECC system 460 may see such an error. However, since the user ECC system 460 receives only a single error bit in the user data bits, the user ECC system 460 correctly detects and corrects the error bit.

Figure 7:
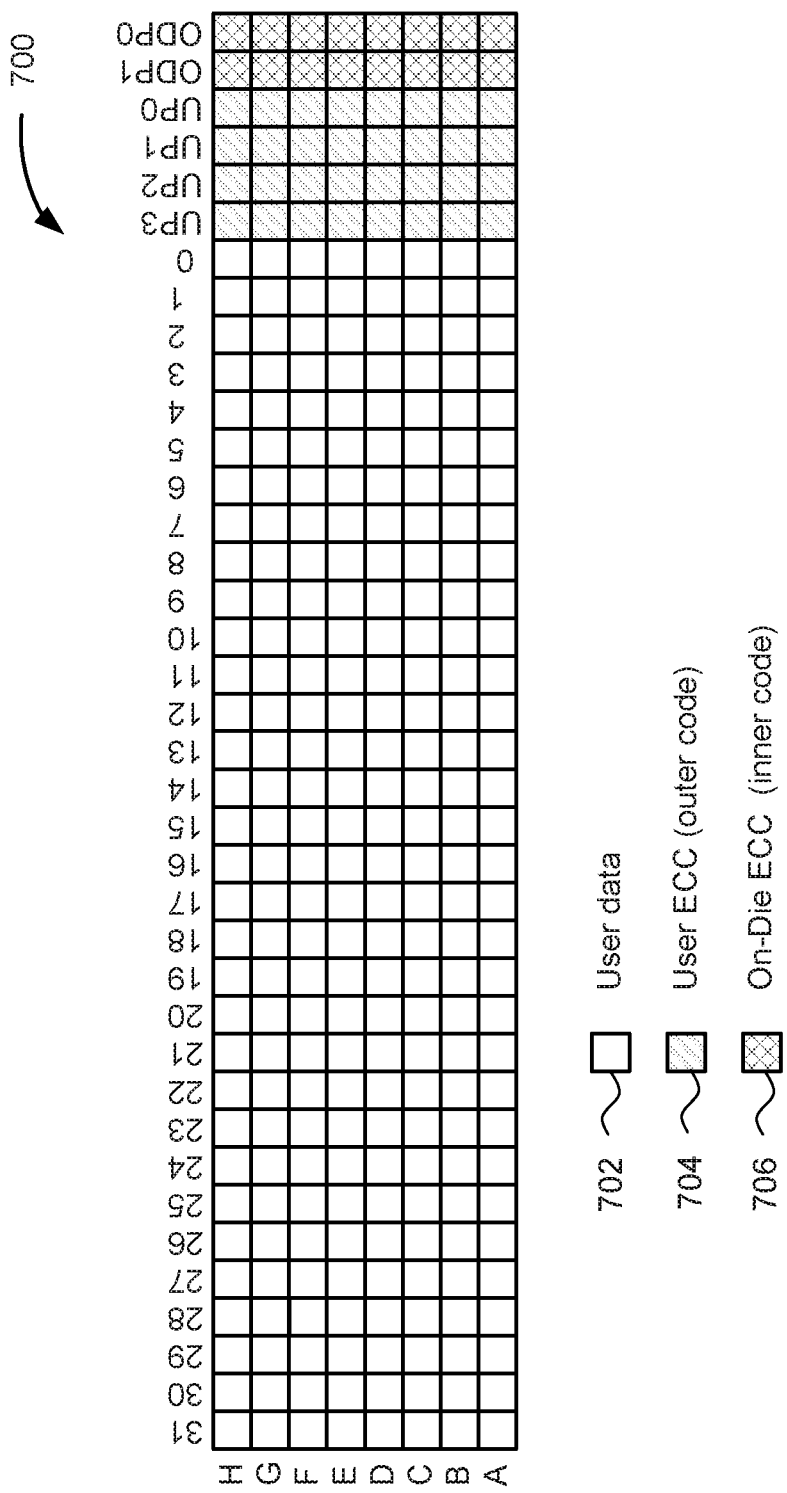
FIG. 7 illustrates a codeword associated with an HBM memory device, according to various embodiments.

FIG. 7 illustrates a codeword 700 associated with an HBM memory device, according to various embodiments. The codeword 700 includes user data bits 702, user ECC bits 704, and on-die ECC bits 706. The codeword 700 is organized into 8 rows, labeled A-H. The user data bits 702 are organized into 32 columns, labeled 31-0. The total number of user data bits 702 is 8×32=256 bits. The user ECC bits 704 are organized into 4 columns, labeled UP3-UP0. The total number of user ECC bits 704 is 8×4=32 bits. The on-die ECC bits 706 are organized into 2 columns, labeled ODP1-ODP0. The total number of on-die ECC bits 706 is 8×2=16 bits. As further described herein, each of the user data bits 702, user ECC bits 704, and on-die ECC bits 706 corresponds to a different column in the H-matrix for the HBM codeword 700.

Figure 8B:
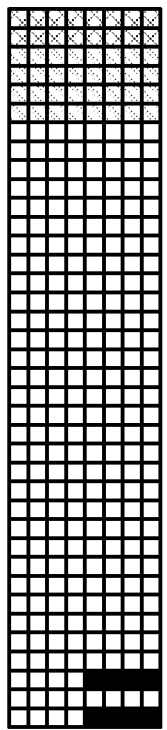
FIGS. 8A-8M illustrate example 8-bit symbols that are preserved by the on-die ECC system of FIG. 4, according to various embodiments.
Figure 8D:
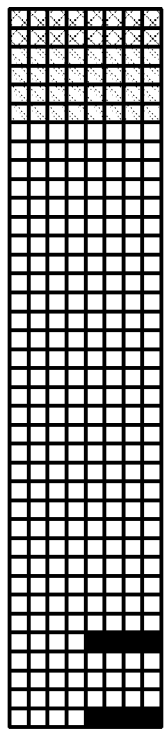
Figure 8F:
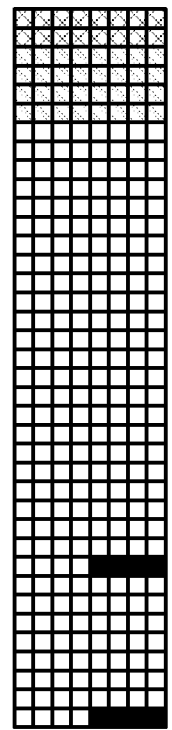
Figure 8H:
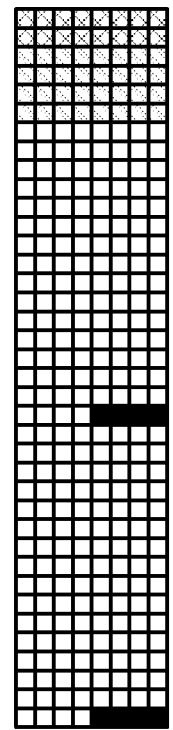
Figure 8A:
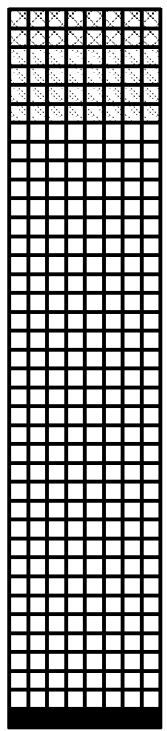
Figure 8C:
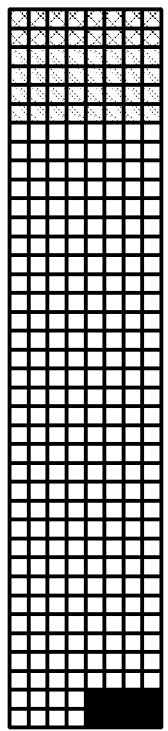
Figure 8E:
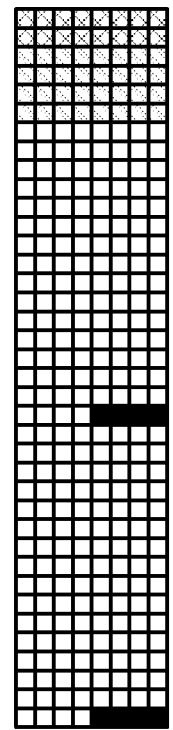
Figure 8G:
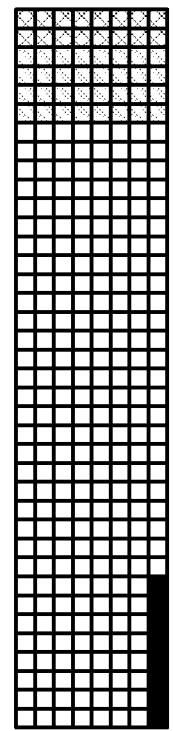
Figure 8J:
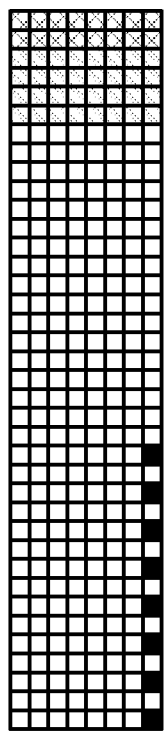
Figure 8L:
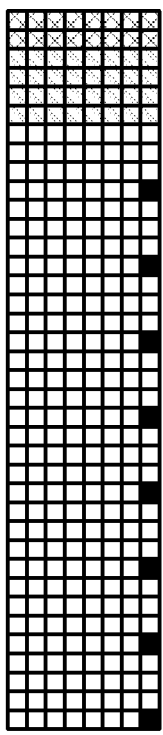
Figure 8I:
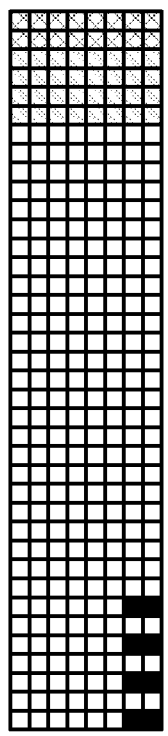
Figure 8K:
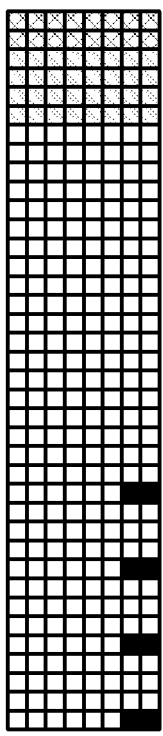
Figure 8M:
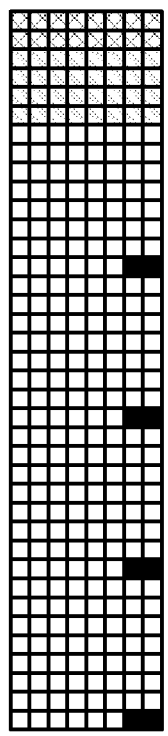

FIGS. 8A-8M illustrate, without limitation, example 8-bit symbols that are preserved by the on-die ECC system 450 of FIG. 4, according to various embodiments. The on-die ECC system 450 preserves 8-bit symbols that include a group of 8 contiguous bits. Such symbols include an 8×1 vertical symbol, as shown in FIG. 8A, or a 1×8 horizontal symbol, as shown in FIG. 8G. The on-die ECC system 450 also preserves 8-bit symbols that include two adjacent groups of 4 contiguous bits. Such symbols include a 4×2 vertical symbol, as shown in FIG. 8C, or a 2×4 horizontal symbol, as shown in FIG. 8E. In addition, the on-die ECC system 450 preserves 8-bit symbols that include two groups of 4 contiguous bits that are separated vertically and/or horizontally by an offset. Such symbols include two 4×1 vertical groups with an offset of 2 bits, as shown in FIG. 8B, an offset of 4 bits, as shown in FIG. 8D, an offset of 8 bits, as shown in FIG. 8F, or an offset of 16 bits, as shown in FIG. 8H. Such symbols further include four 2×1 vertical groups with an offset of 2 bits, as shown in FIG. 8I, an offset of 4 bits, as shown in FIG. 8K, or an offset of 8 bits, as shown in FIG. 8M. Such symbols further include eight individual 1×1 bits with an offset of 2 bits, as shown in FIG. 8J, or an offset of 4 bits, as shown in FIG. 8L.

In addition to the symbols illustrated in FIGS. 8A-8M, the on-die ECC system 450 preserves any 8-bit symbol where the number of rows and the number of columns for each group of bits in the symbol is a power of two, and the vertical and/or horizontal offsets between consecutive groups of bits are also powers of two.

Figure 9A:
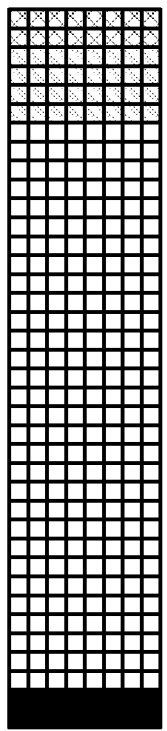
FIGS. 9A-9N illustrate example 16-bit symbols that are preserved by the on-die ECC system of FIG. 4, according to various embodiments.
Figure 9B:
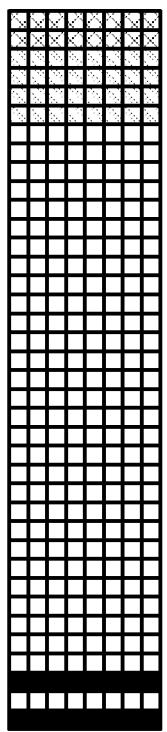
Figure 9C:
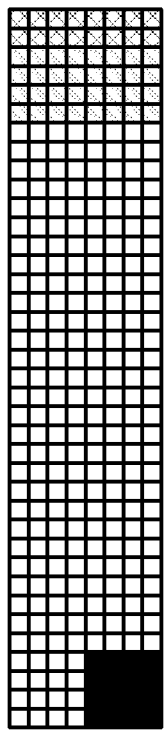
Figure 9D:
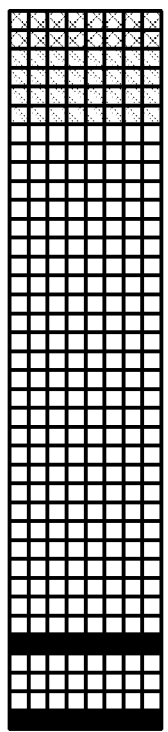
Figure 9E:
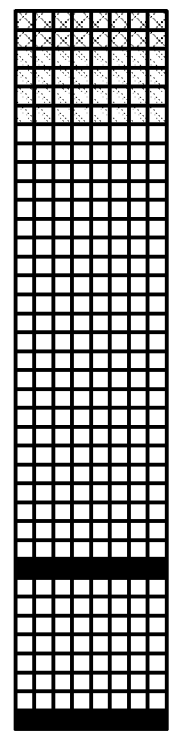
Figure 9F:
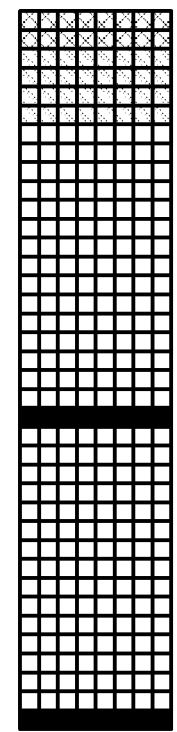
Figure 9G:
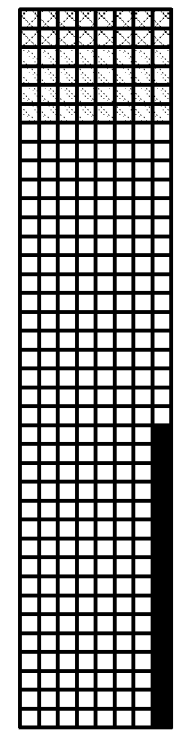
Figure 9H:
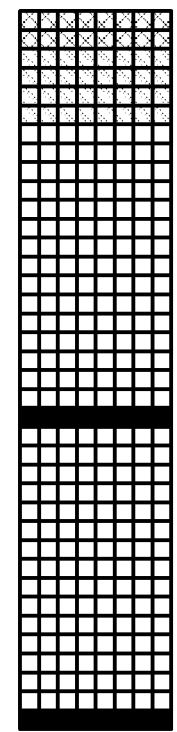
Figure 9J:
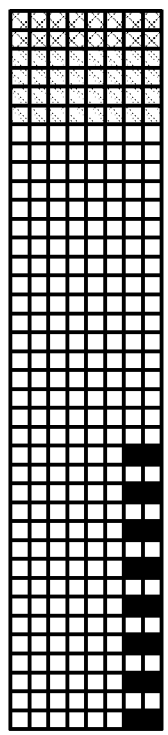
Figure 9L:
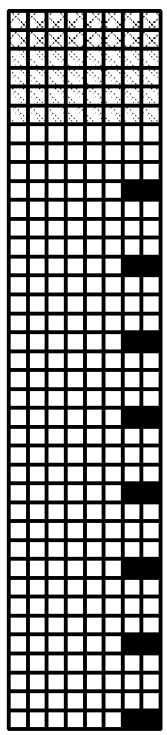
Figure 9N:
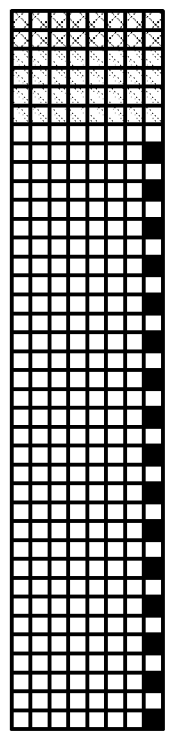
Figure 9I:
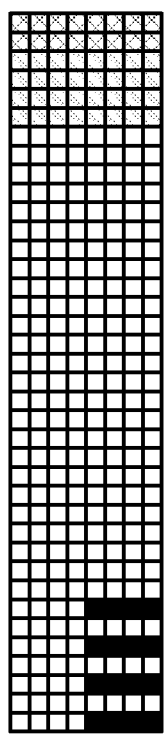
Figure 9K:
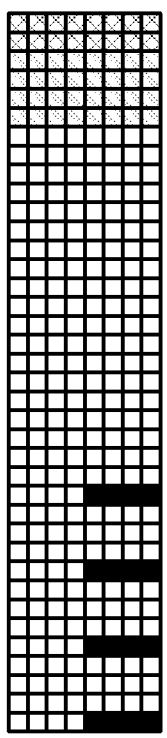
Figure 9M:
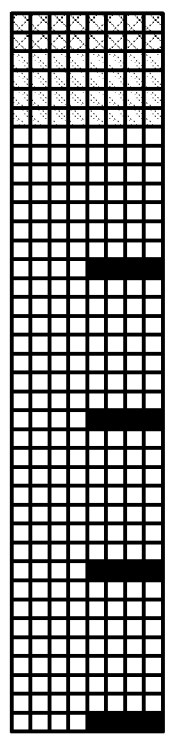

FIGS. 9A-9N illustrate example 16-bit symbols that are preserved by the on-die ECC system 450 of FIG. 4, according to various embodiments. The on-die ECC system 450 preserves 16-bit symbols that include a group of 16 contiguous bits. Such symbols include a 1×16 horizontal symbol, as shown in FIG. 9G. The on-die ECC system 450 also preserves 16-bit symbols that include two adjacent groups of 8 contiguous bits. Such symbols include an 8×2 vertical symbol, as shown in FIG. 9A, or a 2×8 horizontal symbol, as shown in FIG. 9E. In addition, the on-die ECC system 450 preserves 16-bit symbols that include four groups of 4 contiguous bits. Such symbols include an 4×4 symbol, as shown in FIG. 9C. In addition, the on-die ECC system 450 preserves 16-bit symbols that include two groups of 8 contiguous bits that are separated vertically and/or horizontally by an offset. Such symbols include two 8×1 vertical groups with an offset of 2 bits, as shown in FIG. 9B, an offset of 4 bits, as shown in FIG. 9D, an offset of 8 bits, as shown in FIG. 9F, or an offset of 16 bits, as shown in FIG. 9H. Such symbols further include four 4×1 vertical groups with an offset of 2 bits, as shown in FIG. 9I, an offset of 4 bits, as shown in FIG. 9K, or an offset of 8 bits, as shown in FIG. 9M. Such symbols further include eight 2×1 vertical groups with an offset of 2 bits, as shown in FIG. 9J or an offset of 4 bits, as shown in FIG. 9L. Such symbols further include sixteen individual 1×1 bits with an offset of 2 bits, as shown in FIG. 9N.

In addition to the symbols illustrated in FIGS. 9A-9N, the on-die ECC system 450 preserves any 16-bit symbol where the number of rows and the number of columns for each group of bits in the symbol is a power of two, and the vertical and/or horizontal offsets between consecutive groups of bits are also powers of two.

FIGS. 10A-10J illustrate an example H-matrix for an HBM memory device, according to various embodiments. The H-matrix includes a column for each bit in the codeword 700 illustrated in FIG. 7. The H-matrix shown in FIGS. 10A-10J is constructed similar to, and has the same characteristics as, the H-matrix shown in FIGS. 6A-6I, except as further described below. The columns for the user data bits and on-die ECC bits are populated in the manner described for the user data bits of FIGS. 6A-6H and the on-die ECC bits of FIG. 6I, respectively. Each column defines how the on-die ECC system 450 computes the ECC value for the corresponding bit in the codeword 700. Each bit position in the H-matrix represents a value of 1 or a value of 0. For clarity, only the 1 values are shown in FIGS. 10A-10J. A blank bit position indicates a value of 0.

The H-matrix defines the ECC bits that on-die ECC system 450 generates and stores for a particular codeword 700. The H-matrix is constructed such that, as long as all errors lie within a single symbol, any correction or miscorrection performed by the on-die ECC system 450 occurs within the same symbol as the symbol that includes the other error bits. This characteristic results from the fact that most of bits in the H-matrix columns for any group of bits that form a symbol are identical, and this group contains every possible combination of the non-identical bits. Recall that even numbers of error bits will be detected, but not corrected. Since miscorrection occurs only with odd numbers of original error bits, such identical bits will exclusive-or (XOR) right back to their original value. As a result, the error pointer used for correction points to one of the columns of the H-matrix corresponding to the symbol containing the original errors. The only bits that vary are those bits that define the location within the symbol. For example, any 8-bit symbol corresponds to 8 columns in the H-matrix, where those 8 columns have identical bits in all but three bits. Those three non-identical bits define 8 unique locations within the 8 bits that form the symbol. And exclusive-or'ing 3, 5, or 7 sets of the identical bits together results in the same identical bit value. Similarly, any 16-bit symbol corresponds to 16 columns in the H-matrix, where those 16 columns have identical bits in all but four bits. Those four non-identical bits define 16 unique positions within the grouping of 16 bits that form the symbol. And the remaining identical bits XOR back to their original value for any odd number of original error bits, thereby causing a correction, or a miscorrection, to a bit within the same symbol. In general, the non-identical bits XOR to SOME value. Since all possible values of these bits exist within the columns comprising the symbol, the error pointer therefore points to one of these columns. This characteristic exists within the H-matrix regardless of the size, shape, or number of bit groups in the symbol. This characteristic exists for any symbol where the number of rows and the number of columns for each group of bits in the symbol are powers of two, and the vertical and/or horizontal offsets between consecutive groups of bits are also powers of two.

The H-matrix shown in FIGS. 10A-10J is one such matrix and is now described. Notably, the column labeling in the H-matrix corresponds with bit positions in the codeword 700. The labeling of the H-matrix columns defines each bit position by concatenating the row label and the column label of such bit location in FIG. 7. For example, the label A31, thus corresponds to row A, column 31, the label DUP3 corresponds to row D, column UP3, and the label HODP0 corresponds to row H, column ODP0. For the user data bits, shown in FIGS. 10A-10H, the first two rows of the H-matrix, representing bits 2 and 1, are configured to present a counting sequence of 0, 1, 2, 3 that repeats across all the user data bits. In particular, the A31 column has 0 bits for rows 2 and 1, representing a binary value of 00. The A30 column has a 0 bit for row 2 and a 1 bit for row 1, representing a binary value of 01. The A29 column has a 1 bit for row 2 and a 0 bit for row 1, representing a binary value of 10. The A28 column has 1 bits for rows 2 and 1, representing a binary value of 11, and so on. The third row of the H-matrix, representing bit 3, is configured to present a repeating pattern of eight bits that repeats across all the user data bits. The first four bits of each pattern of eight bits represent the exclusive-nor (XNOR) of bits 2 and 1. The second four bits of each pattern of eight bits represent the XOR of bits 2 and 1.

The next three rows of the H-matrix, representing bits 6, 5, and 4, are configured to present the same pattern as the pattern of bits 3, 2, and 1. However, instead of changing the pattern for every consecutive column, the pattern changes every eighth column. Over a span of 32 columns, bits 5 and 4 are configured to present a counting sequence of 0, 1, 2, 3, where each value in the sequence is the same for eight columns. Bit 6 is configured to present a repeating pattern of 64 bits that repeats across all the user data bits. The first 32 bits of each pattern of 64 bits represent the XNOR of bits 5 and 4. The second 32 bits of each pattern of 64 bits represent the XOR of bits 5 and 4.

The next three rows of the H-matrix, representing bits 9, 8, and 7, are configured to present the same pattern as the pattern of bits 3, 2, and 1. However, instead of changing the pattern for every consecutive column, the pattern changes every 64th column. Over a span of 256 columns, bits 8 and 7 are configured to present a counting sequence of 0, 1, 2, 3, where each value in the sequence is the same for 64 columns. Bit 9 is configured to present a repeating pattern of 512 bits, but which stops at the end of the 256 user data bits. In all 256 bits of this truncated pattern, bit 9 represents the XNOR of bits 8 and 7.

Figures 10A, 10B:
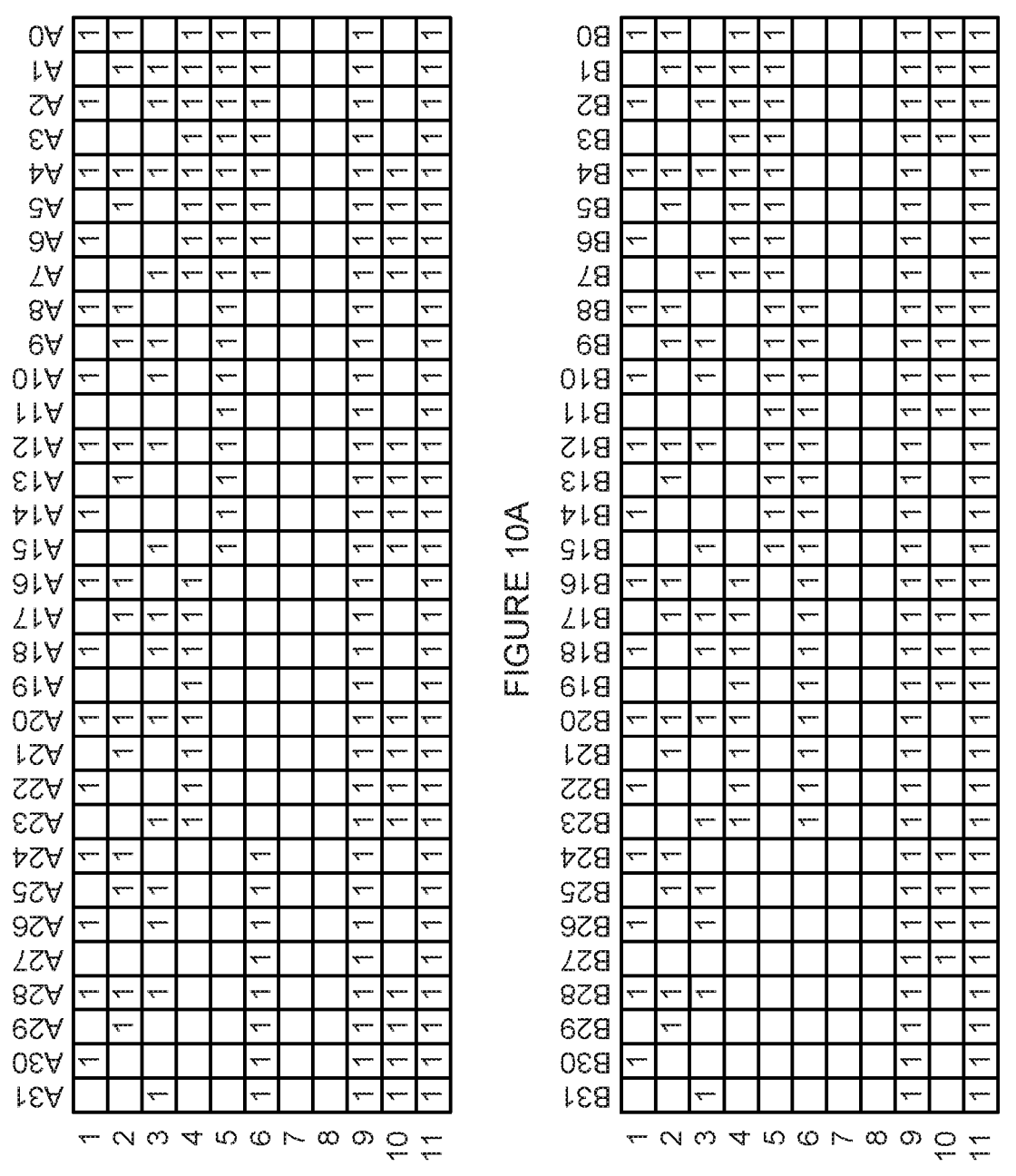
Figures 10C, 10D:
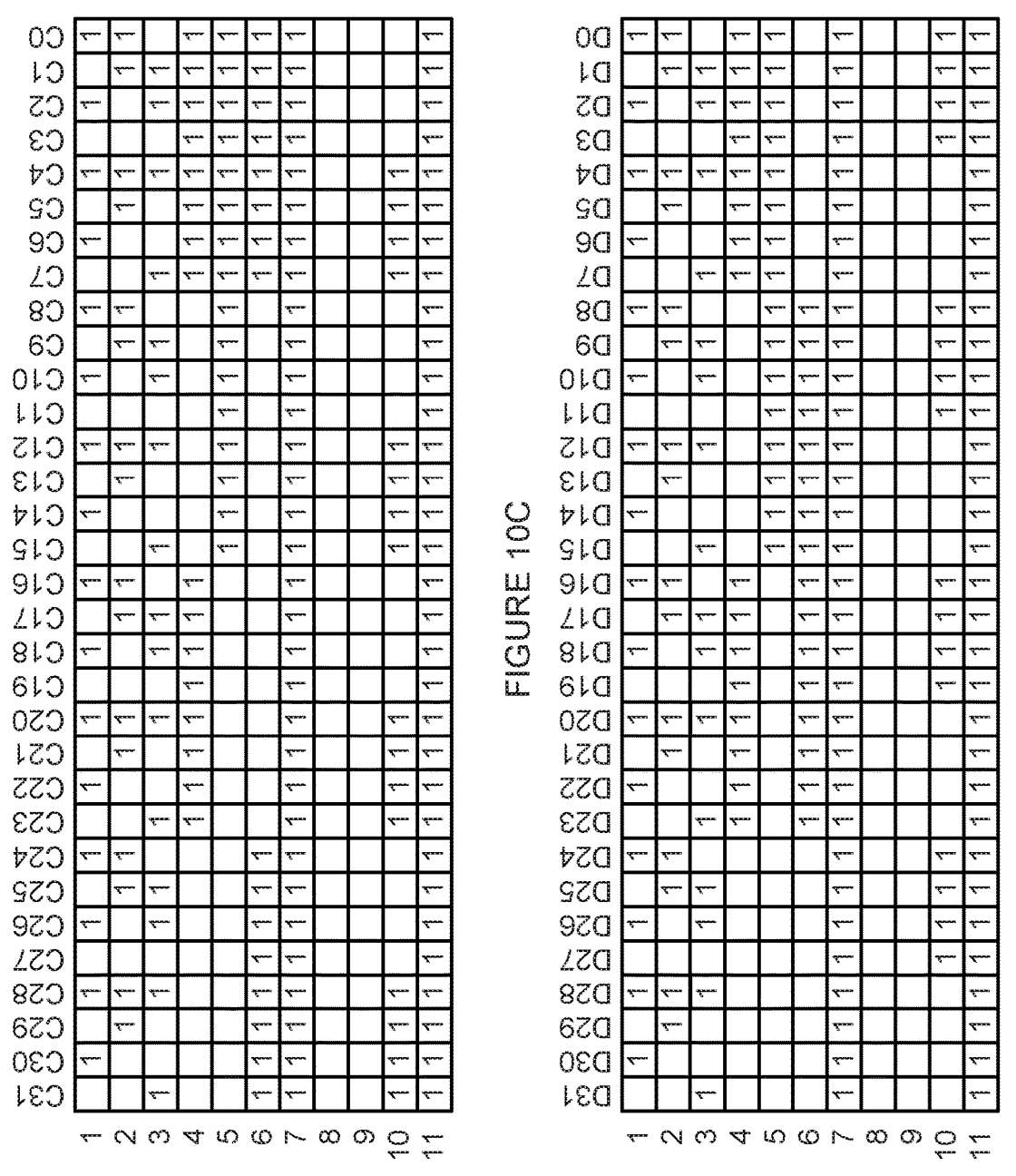
Figures 10E, 10F:
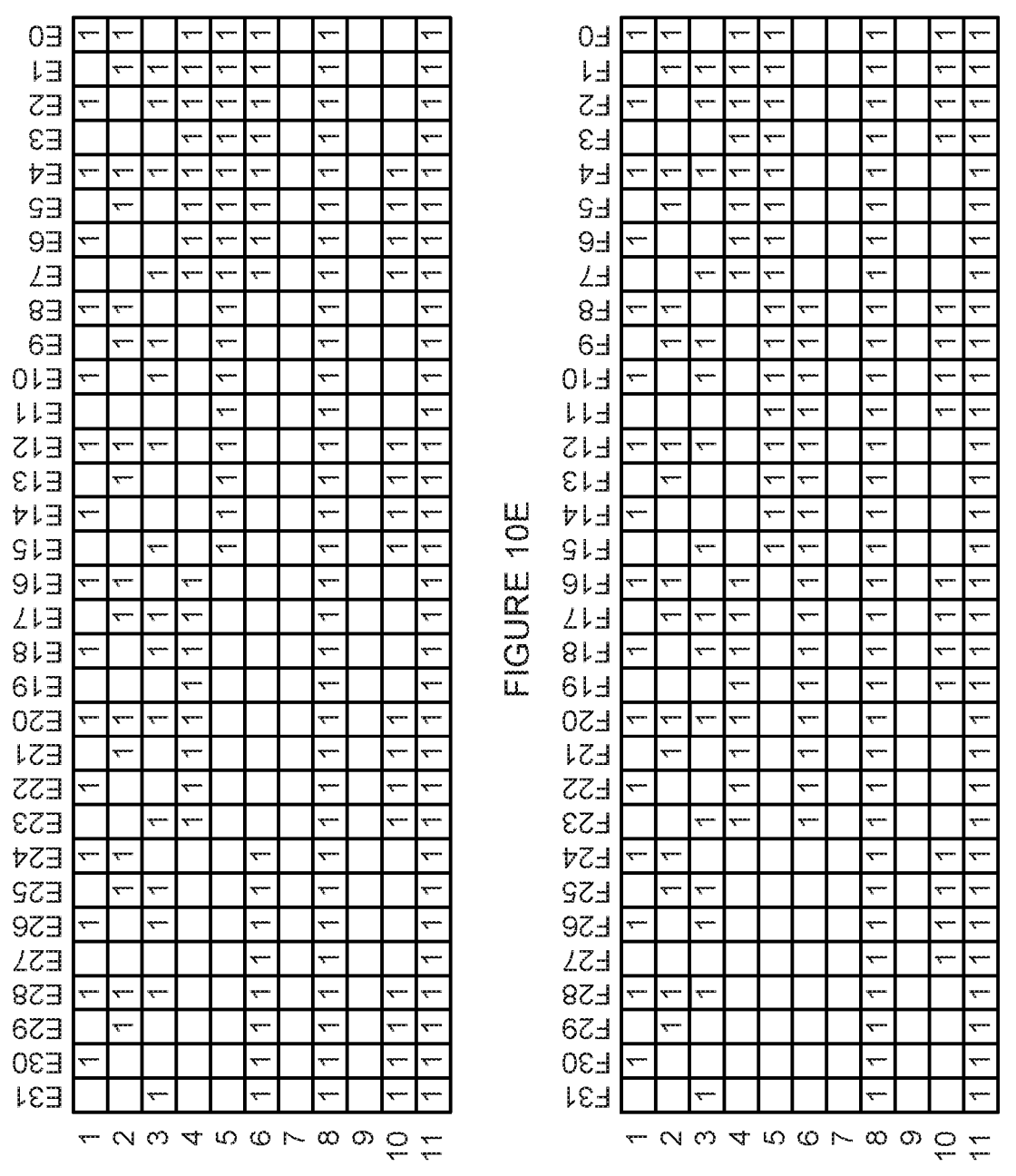
Figures 10G, 10H:
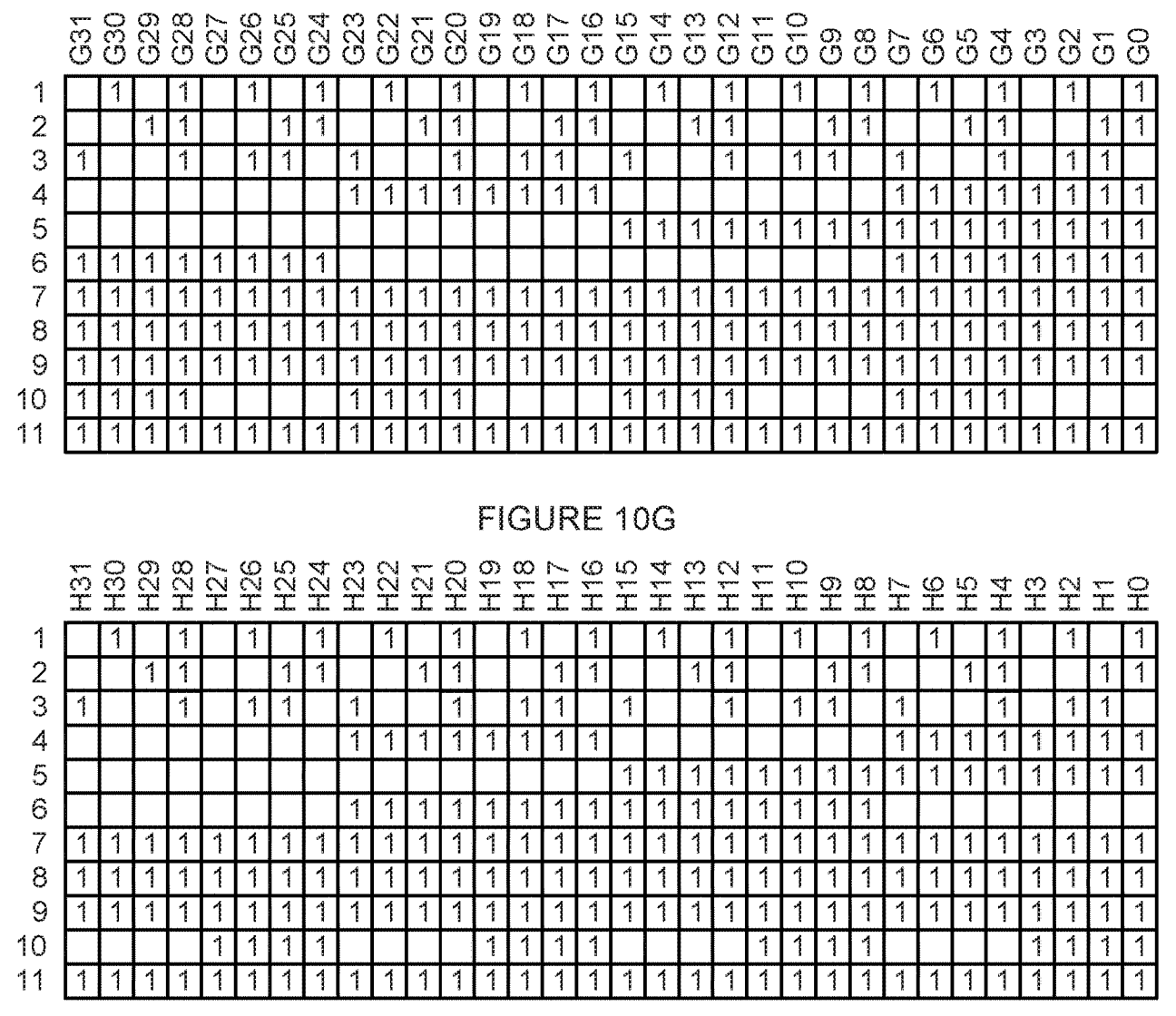
Figures 10I, 10J:
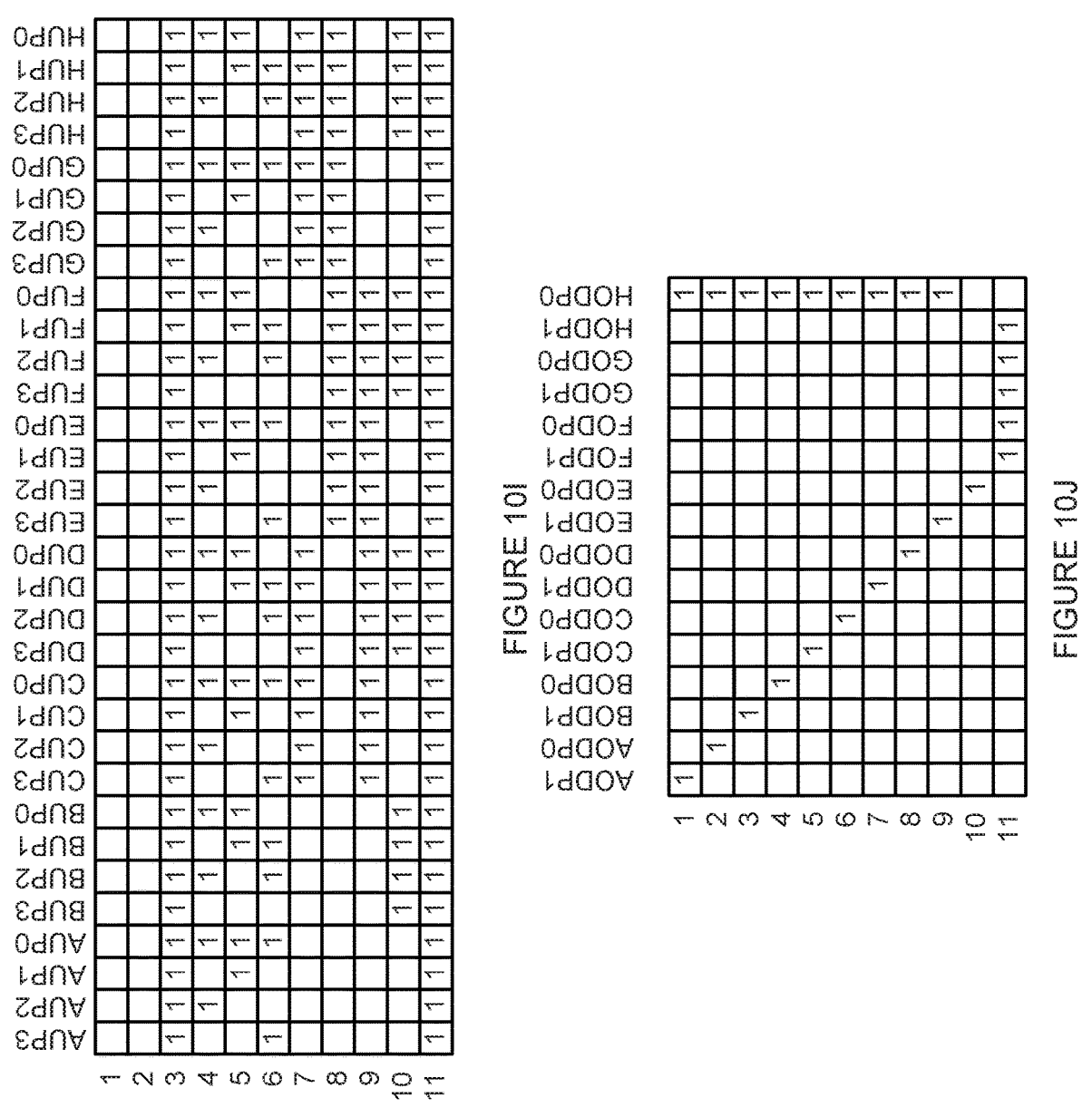

The user ECC bits are shown in FIG. 10I. Although each of the number of user data bits (256) and the number of user ECC bits (32) are powers of two, the total number of user data bits plus the number of user ECC bits is 256+32=288, which is not a power of two. Therefore, the pattern described with respect to the user data bits is not repeated for the user ECC bits. Instead, the portion of the H-matrix corresponding to the 32 bits of user ECC is configured to continue the pattern for user data bits with one change. Each adjacent column in the user ECC portion of the H-matrix represents the value that would fall in every eighth column of the pattern for the user data bits. This ratio is arrived at by dividing the number of user data bits by the number of user ECC bits Therefore, rows 3, 2, 1, and 0 of the user ECC columns have the same value across the user ECC bits. Rows 6, 5, and 4 change values at every adjacent column. Rows 9, 8, and 7 change values at every eighth column. A similar procedure can be applied for configuring the user ECC columns of the H-matrix when the number of user ECC bits is not a power of two. In that case, the number of user data bits would be divided by the number of user ECC bits, and then rounded down to the nearest power of two. Row 11 is populated with 1 for all user data bits and user ECC bits. Row 11 is populated with 0 for all on-die ECC bits, with the exception described in the next two paragraphs. Row 10 is a parity bit that is populated such that each column of the H-matrix has an odd number of 1 bits, resulting in odd parity.

For the on-die ECC bits, shown in FIG. 10J, the first 10 columns, AODP1-EODP0, form a unity matrix for ease in the ECC encoding process, as is common in many H-matrices. FODP1 is a special case which is described below. Ignoring FODP1 for the moment, row 11 is set to 1 for all user data bits and is set to 0 for all on-die ECC bits. Consequently, an error in an odd number of user data bits generates an ECC syndrome with a 1 in this position. In contrast, an error in an odd number of on-die ECC bits generates an ECC syndrome with a 0 in this position. This bit thus distinguishes whether correction takes place in the user data bits or in the on-die ECC bits.

Bit FODP1 is the exception to this rule. An error in an odd number of on-die ECC bits that includes FODP1 generates an ECC syndrome with a 1 in this position, thereby incorrectly appearing to be an error in the user data bits. To prevent this condition, the value of FODP1 is replicated in FODP0-HODP1. All 5 of these bits should be 0 or all 5 of these bits should be 1. If these 5 bits do not all agree, the error is considered uncorrectable. If these 5 bits all agree, the likelihood that the values of these bits are correct is relatively certain. Alternatively, in some embodiments, the correct value for the FODP1 bit may be determined by majority voting logic. Accordingly, the FODP1 bit is replicated in FODP0-HODP1, resulting in an odd number of bits, including FODP1 and the replicas in FODP0-HODP1. Having an odd number of bits prevents a tie in the majority voting logic. The HODP0 bit is not used, and the value of the HODP0 bit is set to a unique encoding which does not appear elsewhere in the H-matrix.

As described herein, row 10 is populated such that all of the columns have odd parity. Therefore, row 10 has a 1 value for any column that would otherwise have even parity. The value of this approach lies in differentiating even numbers of error bits from odd numbers of error bits. An even number of error bits results in an ECC syndrome with an even parity. Conversely, an odd number of error bits results in an ECC syndrome with an odd parity. The ECC system 450 does not attempt correction if the parity of the ECC syndrome is even, but only when the parity of the ECC syndrome is odd. This result is important in order to maintain the condition described previously herein, where those bits which are identical within a symbol XOR back to the same value, thus pointing somewhere within the same symbol. The resulting H-matrix exhibits characteristic of symbol preservation in the presence of multiple error bits within a single symbol. If multiple error bits exist in a symbol, then the on-die ECC system 450 does not miscorrect a bit into a different symbol.

In the H-matrix of FIGS. 10A-10J, row 1 defines the XOR tree for on-die ECC bit AODP1. Similarly, row 2 defines the XOR tree for bit AODP0, row 3 defines the XOR tree for bit BODP1, row 4 defines BODP0, and so on, for each of rows 11-1 of the H-matrix. The on-die ECC system 450 checks rows 11-1 of the H-matrix to determine whether an error bit exists in a codeword. A zero result for these 11 bits indicates no error. Any non-zero result indicates an error. In the case of an error, the on-die ECC system 450 checks the ECC syndrome for even or odd parity. If the ECC syndrome has even parity, the error is uncorrectable, and the on-die ECC system 450 does not perform any correction. In the case of an error with odd ECC syndrome parity, the on-die ECC system 450 employs all 11 bits of the H-matrix to form a pointer to the error bit for correction.

By differentiating user data bits and user ECC bits from on-die ECC bits, row 11 prevents the on-die ECC system 450 from miscorrecting on-die ECC bits based on multiple error bits in the user data bits and/or user ECC bits. Similarly, row 11 prevents the on-die ECC system 450 from miscorrecting user data bits and user ECC bits based on multiple error bits in the on-die ECC error bits.

In some embodiments, if none of the on-die ECC bits are visible to the user ECC system 460, then row 11 of the H-matrix may be eliminated, and the on-die ECC system 450 may employ a 10-row H-matrix. In such embodiments, multiple error bits in in the user data bits and/or user ECC bits may cause miscorrection of a single on-die ECC bit. However, since the on-die ECC bits are not transferred to the MMU 320, the user ECC system 460 does not see this type of error. Therefore, such an error has no negative effect on the user ECC system 460. Further, multiple error bits in the on-die ECC bits may cause miscorrection of a single user data bit or user ECC bit. The user ECC system 460 may see such an error. However, since the user ECC system 460 receives only a single error bit in the user data bits and user ECC bits, the user ECC system 460 correctly detects and corrects the error bit.

Figure 11:
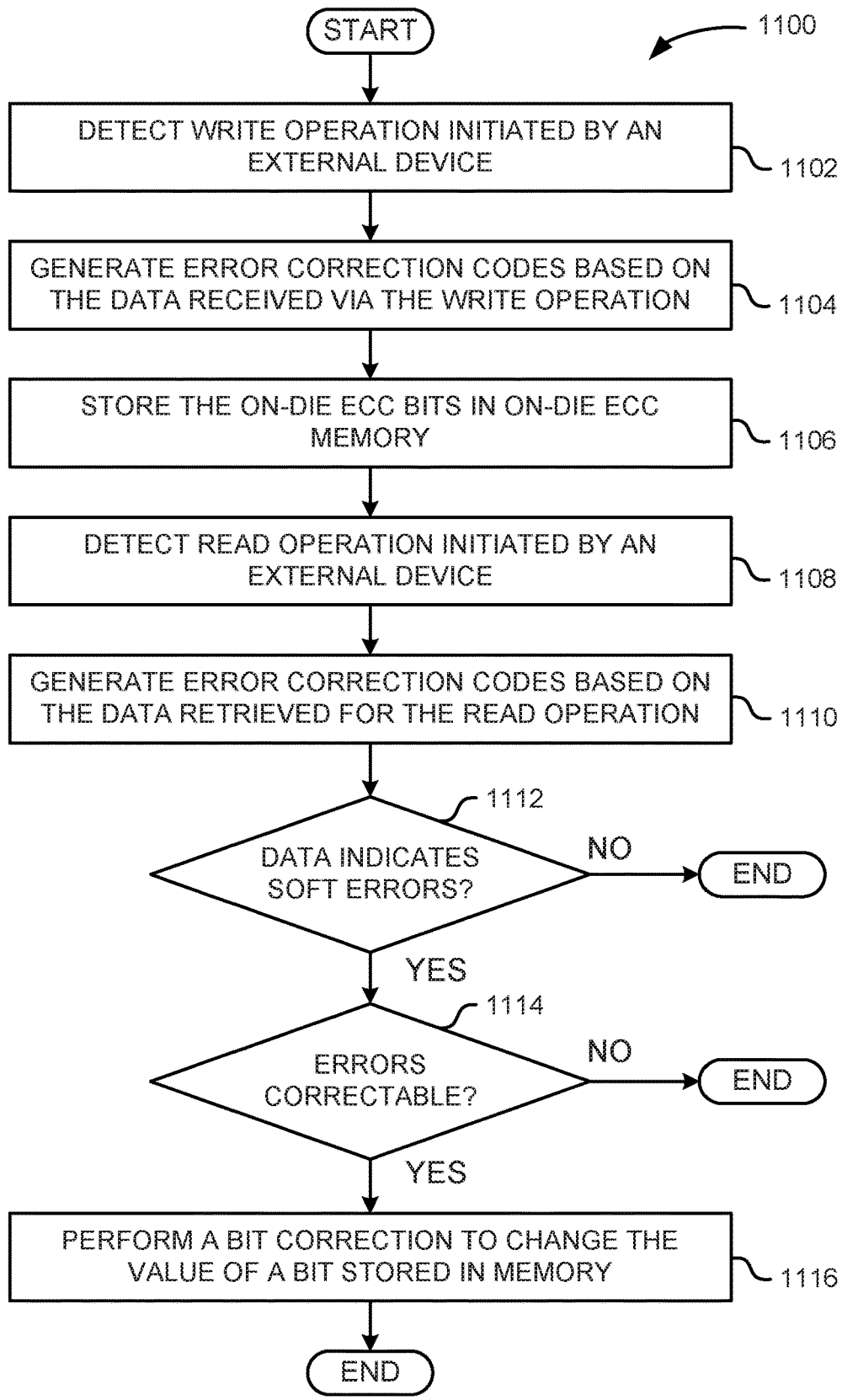
FIG. 11 is a flow diagram of method steps for generating error correction codes within an ECC system, according to various embodiments.

FIG. 11 is a flow diagram of method steps for generating error correction codes within an ECC system 400, according to various embodiments. Although the method steps are described in conjunction with the systems of FIGS. 1-10J, persons of ordinary skill in the art will understand that any system configured to perform the method steps, in any order, is within the scope of the present disclosure.

As shown, a method 1100 begins at step 1102, where an on-die ECC system 450 detects a write operation initiated by an external device, such as the MMU 320 of FIGS. 3 and 4. During the write operation, the memory subsystem stores data received from the external device into user data memory 420 and, optionally, to user ECC memory 430. At step 1104, the on-die ECC system 450 generates error correction codes based on the received data. The on-die ECC system 450 generates the on-die ECC bits based on an H-matrix that is configured to preserve symbols of any size, shape, and offset. More specifically, the on-die ECC system 450 preserves symbols that include one or more bit rectangles of arbitrary size and shape, where the dimensions of each rectangle are powers of two, and where the vertical and horizontal offset between consecutive rectangles are also powers of two. At step 1106, the on-die ECC system 450 stores the on-die ECC bits in on-die ECC memory 440.

Subsequently, at step 1108, the on-die ECC system 450 detects a read operation initiated by an external device, such as the MMU 320 of FIGS. 3 and 4. During the read operation, the memory subsystem retrieves data from user data memory 420, on-die ECC memory 440, and, optionally, from user ECC memory 430. At step 1110, the on-die ECC system 450 generates error correction codes based on the retrieved data. At step 1111, the on-die ECC system 450 determines whether the data is indicative of one or more soft errors. If the on-die ECC system 450 determines that the data is not indicative of one or more soft errors, then the method 1100 terminates. If, on the other hand, the on-die ECC system 450 determines that the data is indicative of one or more soft errors, then the method 1100 proceeds to step 1114, where the on-die ECC system 450 determines whether the detected errors are correctable. In general, the detected errors are deemed correctable if the on-die ECC system 450 detects an odd number of errors.

If the on-die ECC system 450 determines that the detected errors are not correctable, then the method 1100 terminates. If, on the other hand, the on-die ECC system 450 determines that the detected errors are correctable, then the method 1100 proceeds to step 1116, where the on-die ECC system 450 performs a bit correction operation to change the value of a bit stored in the user data memory 420, user ECC memory 430, or on-die ECC memory 440. If all original error bits are included in a single symbol, then the on-die ECC system 450 performs the correction (or miscorrection) in that symbol. If the data includes only one error bit, then the correction is successful. If, on the other hand, the data includes more than one error bit, then the on-die ECC system 450 may perform a miscorrection, thereby changing the value in a valid bit to the wrong value. In such cases, the on-die ECC system 450 miscorrects a data bit that is included in the same symbol that includes the other error bits. As a result, a user ECC system 460 is able to correct the miscorrection via symbol-based ECC, striping-based ECC, and/or other ECC techniques. The method 1100 then terminates.

In sum, various embodiments include an on-die ECC system that preserves rectangular symbols of arbitrary size and shape, where the dimensions of the symbol are powers of two. Further, the on-die ECC system preserves symbols that include multiple rectangles of arbitrary size and shape, where the dimensions of each rectangle are powers of two, and where the vertical and horizontal offset between adjacent rectangles are also powers of two. If the on-die ECC system miscorrects a memory bit, then the miscorrection is constrained or restricted to be in the same symbol that includes the other error bits, assuming that all of the original errors fall within a single symbol. Therefore, all error bits, including the miscorrected bit, are in the same symbol. As a result, a symbol-based user ECC system can correct and detect any number of errors within a single symbol, even when the on-die ECC system miscorrects a memory bit.

At least one technical advantage of the disclosed techniques relative to the prior art is that, with the disclosed techniques, miscorrections generated by an on-die ECC system are constrained or restricted to be within the smallest reasonable symbol that includes all of the other error bits. As a result, the error bits included in the codeword transmitted by the memory device are all within the same symbol. As a result, a user ECC system, such as a symbol-based user ECC system, is able to correct all of the actual error bits as well as the miscorrected bit. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating error correction codes within an error correction code system, the method comprising:
   generating values for a plurality of on-die error correction code (ECC) bits based on a plurality of data bits and a parity-check matrix;
   determining, based on the parity-check matrix, that a first value stored in a first bit included in at least one of the plurality of on-die ECC bits or the plurality of data bits is incorrect, wherein the parity-check matrix restricts the first bit to a location within a symbol that includes a second bit, and wherein a second value stored in the second bit is incorrect; and
   modifying the first value stored in the first bit.

2. The computer-implemented method of claim 1, wherein the data bits comprise one or more of user data bits or user ECC bits.

3. The computer-implemented method of claim 1, wherein:
   the data bits comprise user data bits and user ECC bits,
   a number of user data bits comprises a power of two,
   a number of user ECC bits comprises a power of two, and
   a sum of the number of user data bits and the number of user ECC bits is not a power of two.

4. The computer-implemented method of claim 1, wherein:
   the data bits comprise user data bits and user ECC bits, and
   a number of user ECC bits is not a power of two.

5. The computer-implemented method of claim 1, wherein:
   the symbol comprises a group of memory bits included in the at least one of the plurality of on-die ECC bits or the plurality of data bits;
   the symbol comprises a rectangular shape within a memory device that includes the at least one of the plurality of on-die ECC bits or the plurality of data bits; and
   a first dimension of the symbol and a second dimension of the rectangular shape are powers of two.

6. The computer-implemented method of claim 1, wherein:
   the symbol comprises a group of memory bits included in the at least one of the plurality of on-die ECC bits or the plurality of data bits,
   the symbol comprises a plurality of rectangular shapes within a memory device that includes the at least one of the plurality of on-die ECC bits or the plurality of data bits,
   for each rectangular shape included in the plurality of rectangular shapes, a first dimension of the rectangular shape and a second dimension of the rectangular shape are powers of two, and
   at least one of a vertical offset or a horizontal offset between a first rectangular shape included in the plurality of rectangular shapes and a second rectangular shape included in the plurality of rectangular shapes consecutive to the first rectangular shape comprises a power of two.

7. The computer-implemented method of claim 1, wherein:
   the parity-check matrix includes an on-die ECC section and a user section, and
   no column of the on-die ECC section replicates any column of the user section.

8. The computer-implemented method of claim 1, wherein the plurality of on-die ECC bits and the plurality of data bits are included in a high-bandwidth memory (HBM) device or a low power double data rate (LPDDR) memory device.

9. The computer-implemented method of claim 1, wherein:
   the first bit is included in the plurality of on-die ECC bits, and
   the parity-matrix restricts the second bit to a location that is included in the plurality of on-die ECC bits.

10. The computer-implemented method of claim 1, wherein:
    the first bit is included in the plurality of data bits, and
    the parity-matrix restricts the second bit to a location that is included in the plurality of data ECC bits.

11. One or more non-transitory computer-readable media storing program instructions that, when executed by one or more processors, cause the one or more processors to perform steps of:
    generating values for a plurality of on-die error correction code (ECC) bits based on a plurality of data bits and a parity-check matrix;
    determining, based on the parity-check matrix, that a first value stored in a first bit included in at least one of the plurality of on-die ECC bits or the plurality of data bits is incorrect, wherein the parity-check matrix restricts the first bit to a location within a symbol that includes a second bit, and wherein a second value stored in the second bit is incorrect; and
    modifying the first value stored in the first bit.

12. The one or more non-transitory computer-readable media of claim 11, wherein the data bits comprise one or more of user data bits or user ECC bits.

13. The one or more non-transitory computer-readable media of claim 11, wherein:
    the data bits comprise user data bits and user ECC bits,
    the user data bits, user ECC bits, and on-die ECC bits are arranged into a plurality of codewords, and
    each codeword includes a user data array of eight rows by thirty-two columns, a user ECC array of eight rows by four columns, and an on-die ECC array of eight rows by two columns.

14. The one or more non-transitory computer-readable media of claim 11, wherein:
    the data bits and on-die ECC bits are arranged into a plurality of codewords, and
    each codeword includes a data array of sixteen rows by sixteen columns and an on-die ECC array of one row by sixteen columns.

15. The one or more non-transitory computer-readable media of claim 11, wherein:
   the symbol comprises a group of memory bits included in the at least one of the plurality of on-die ECC bits or the plurality of data bits;
   the symbol comprises a rectangular shape within a memory device that includes the at least one of the plurality of on-die ECC bits or the plurality of data bits; and
   a first dimension of the symbol and a second dimension of the rectangular shape are powers of two.

16. The one or more non-transitory computer-readable media of claim 11, wherein:
   the symbol comprises a group of memory bits included in the at least one of the plurality of on-die ECC bits or the plurality of data bits,
   the symbol comprises a plurality of rectangular shapes within a memory device that includes the at least one of the plurality of on-die ECC bits or the plurality of data bits,
   for each rectangular shape included in the plurality of rectangular shapes, a first dimension of the rectangular shape and a second dimension of the rectangular shape are powers of two, and
   at least one of a vertical offset or a horizontal offset between a first rectangular shape included in the plurality of rectangular shapes and a second rectangular shape included in the plurality of rectangular shapes consecutive to the first rectangular shape comprises a power of two.

17. The one or more non-transitory computer-readable media of claim 11, wherein:
   the parity-check matrix includes an on-die ECC section and a user section, and
   no column of the on-die ECC section replicates any column of the user section.

18. A system, comprising:
   on-die error correction code (ECC) memory that includes a plurality of on-die ECC bits;
   data memory that includes a plurality of data bits; and
   an on-die ECC subsystem that:
      generates values for the plurality of on-die ECC bits based on the plurality of data bits and a parity-check matrix,
      determines, based on the parity-check matrix, that a first value stored in a first bit included in at least one of the plurality of on-die ECC bits or the plurality of data bits is incorrect, wherein the parity-check matrix restricts the first bit to a location within a symbol that includes a second bit, and wherein a second value stored in the second bit is incorrect, and
      modifies the first value stored in the first bit.

19. The system of claim 18, wherein the on-die ECC memory and the user memory are included in a high-bandwidth memory (HBM) device or a low-power double data rate (LPDDR) memory device.

20. The system of claim 18, wherein the data memory comprises a user data memory that includes a first portion of the plurality of data bits and a user ECC memory that comprises a second portion of the plurality of data bits.

* * * * *